(12) United States Patent  (10) Patent No.: US 8,809,862 B2
Takano et al.  (45) Date of Patent: Aug. 19, 2014

(54) SEMICONDUCTOR DEVICE AND MANUFACTURING METHOD OF THE SAME

(75) Inventors: Tamae Takano, Kanagawa (JP); Atsuo Isobe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 883 days.

(21) Appl. No.: 12/909,393

(22) Filed: Oct. 21, 2010

(65) Prior Publication Data

US 2011/0031561 A1  Feb. 10, 2011

Related U.S. Application Data

(63) Continuation of application No. 11/434,163, filed on May 16, 2006, now Pat. No. 7,829,394.

(30) Foreign Application Priority Data

May 26, 2005  (JP) ................................. 2005-153834

(51) Int. Cl.
 *H01L 29/04* (2006.01)
(52) U.S. Cl.
 USPC ................ 257/59; 257/72; 438/149; 438/151
(58) Field of Classification Search
 CPC ............ H01L 29/786; H01L 29/78618; H01L 29/78621; H01L 29/78624; H01L 27/1214; H01L 27/12
 USPC ................ 257/E51.005, E51.006, 57, 59, 72; 438/149–155
 See application file for complete search history.

(56) References Cited

U.S. PATENT DOCUMENTS 5,923,961 A  7/1999 Shibuya et al.

5,994,738 A  11/1999 Wollesen
 (Continued)

FOREIGN PATENT DOCUMENTS

JP  58-031570  2/1983
JP  04-034980  2/1992
 (Continued)

OTHER PUBLICATIONS

Korean Office Action (Application No. 2006-0044650; KR08772) Dated Jun. 14, 2012.
 (Continued)

*Primary Examiner* — Khiem D Nguyen
(74) *Attorney, Agent, or Firm* — Nixon Peabody, LLP; Jeffrey L. Costellia

(57) ABSTRACT

The present invention provides a semiconductor device which suppresses a short circuit and a leakage current between a semiconductor film and a gate electrode generated by a break or thin thickness of a gate insulating film in an end portion of a channel region of the semiconductor film, and the manufacturing method of the semiconductor device. Plural thin film transistors which each have semiconductor film provided over a substrate continuously, conductive films provided over the semiconductor film through a gate insulating film, source and drain regions provided in the semiconductor film which are not overlapped with the conductive films, and channel regions provided in the semiconductor film existing under the conductive films and between the source and drain regions. And impurity regions provided in the semiconductor film which is not overlapped with the conductive film and provided adjacent to the source and drain regions. Further, the conductive films are provided over the channel regions and regions of the semiconductor film which are provided adjacent to the channel regions.

21 Claims, 21 Drawing Sheets

(56) References Cited

U.S. PATENT DOCUMENTS

| | | | |
|---|---|---|---|
| 6,020,222 A | 2/2000 | Wollesen | |
| 6,031,249 A | 2/2000 | Yamazaki et al. | |
| 6,218,714 B1 | 4/2001 | Yamazaki | |
| 6,303,963 B1 | 10/2001 | Ohtani et al. | |
| 6,355,941 B1 | 3/2002 | Yamazaki et al. | |
| 6,358,766 B1 | 3/2002 | Kasahara | |
| 6,388,291 B1 | 5/2002 | Zhang et al. | |
| 6,399,988 B1 | 6/2002 | Yamazaki | |
| 6,433,361 B1 | 8/2002 | Zhang et al. | |
| 6,469,317 B1 | 10/2002 | Yamazaki et al. | |
| 6,501,098 B2 * | 12/2002 | Yamazaki | 257/72 |
| 6,512,271 B1 | 1/2003 | Yamazaki et al. | |
| 6,515,336 B1 | 2/2003 | Suzawa et al. | |
| 6,534,826 B2 | 3/2003 | Yamazaki | |
| 6,573,533 B1 | 6/2003 | Yamazaki | |
| 6,576,924 B1 | 6/2003 | Yamazaki et al. | |
| 6,583,471 B1 | 6/2003 | Yamazaki et al. | |
| 6,627,952 B1 | 9/2003 | Wollesen | |
| 6,727,124 B2 | 4/2004 | Nakajima et al. | |
| 6,867,462 B2 | 3/2005 | Nakazawa et al. | |
| 6,940,138 B2 | 9/2005 | Yamazaki | |
| 2002/0016028 A1 * | 2/2002 | Arao et al. | 438/149 |
| 2003/0160236 A1 | 8/2003 | Yamazaki et al. | |
| 2004/0063256 A1 * | 4/2004 | Ishikawa | 438/149 |

FOREIGN PATENT DOCUMENTS

| | | |
|---|---|---|
| JP | 06-260651 | 9/1994 |
| JP | 08-018055 | 1/1996 |
| JP | 10-135470 | 5/1998 |
| JP | 11-214696 | 8/1999 |
| JP | 2000-111946 | 4/2000 |
| JP | 2001-094114 | 4/2001 |
| JP | 2002-509360 | 3/2002 |
| JP | 2004-096104 | 3/2004 |
| JP | 2005-064123 | 3/2005 |
| KR | 2002-0035461 | 5/2002 |
| WO | WO-99/31731 A2 | 6/1999 |

OTHER PUBLICATIONS

Chinese Office Action (Application No. 2006/10087813.4; CN08772) dated Sep. 11, 2009 with English Translation.

* cited by examiner 603  602  101

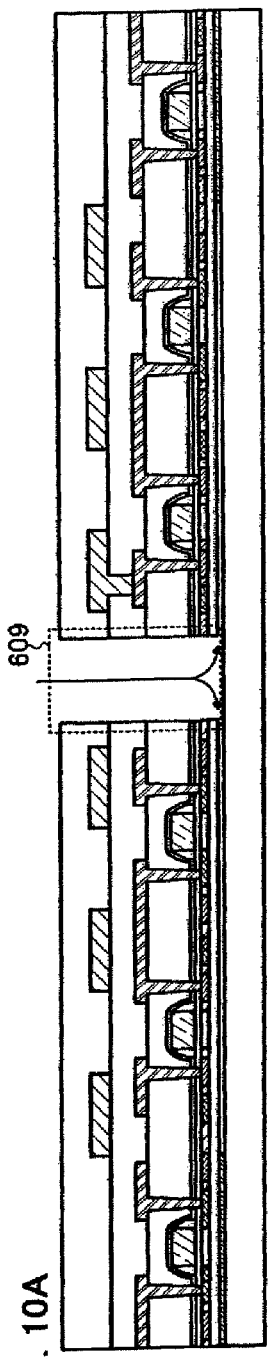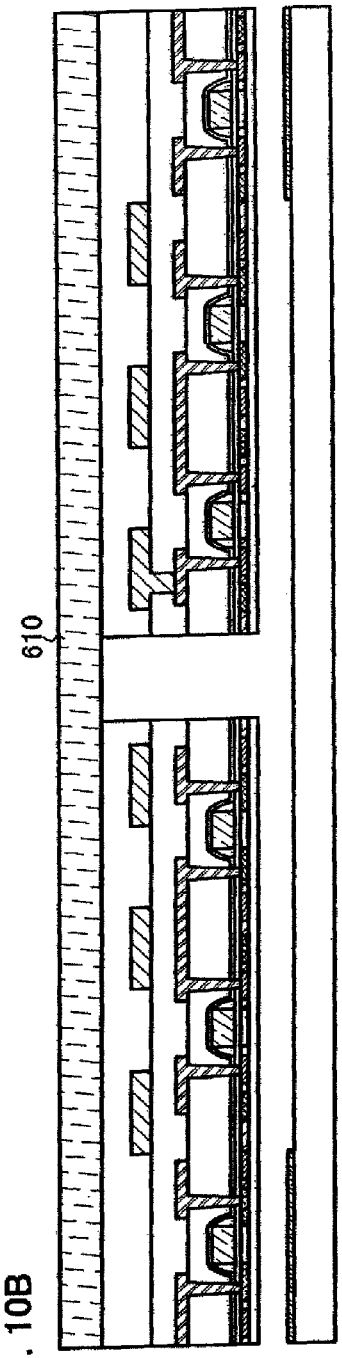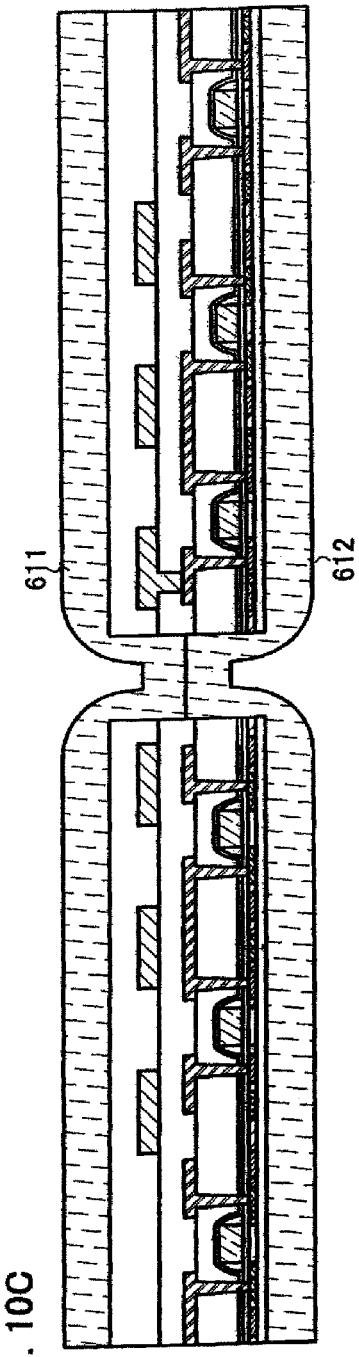

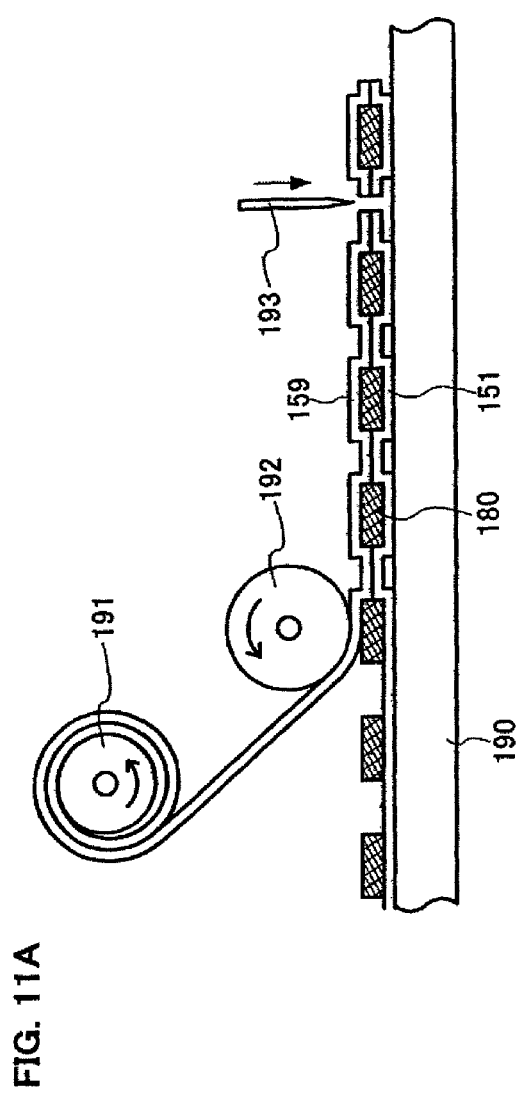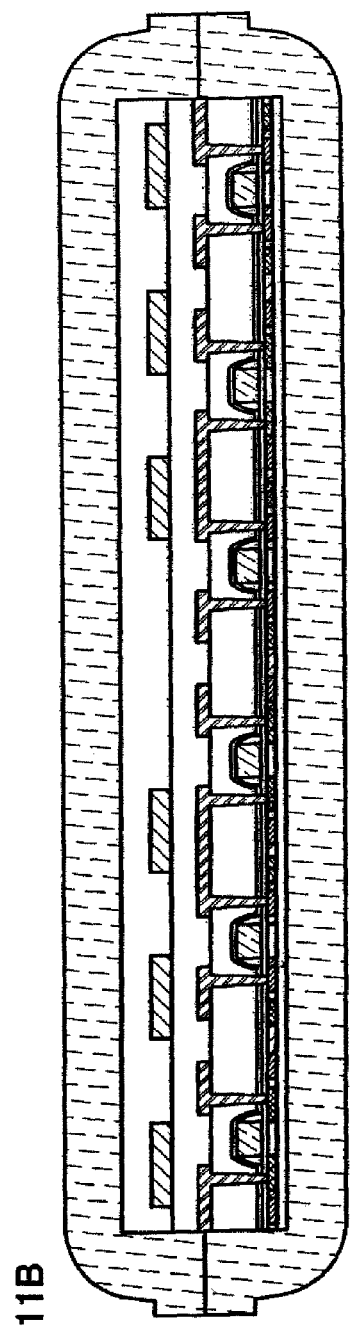
FIG. 11A
FIG. 11B

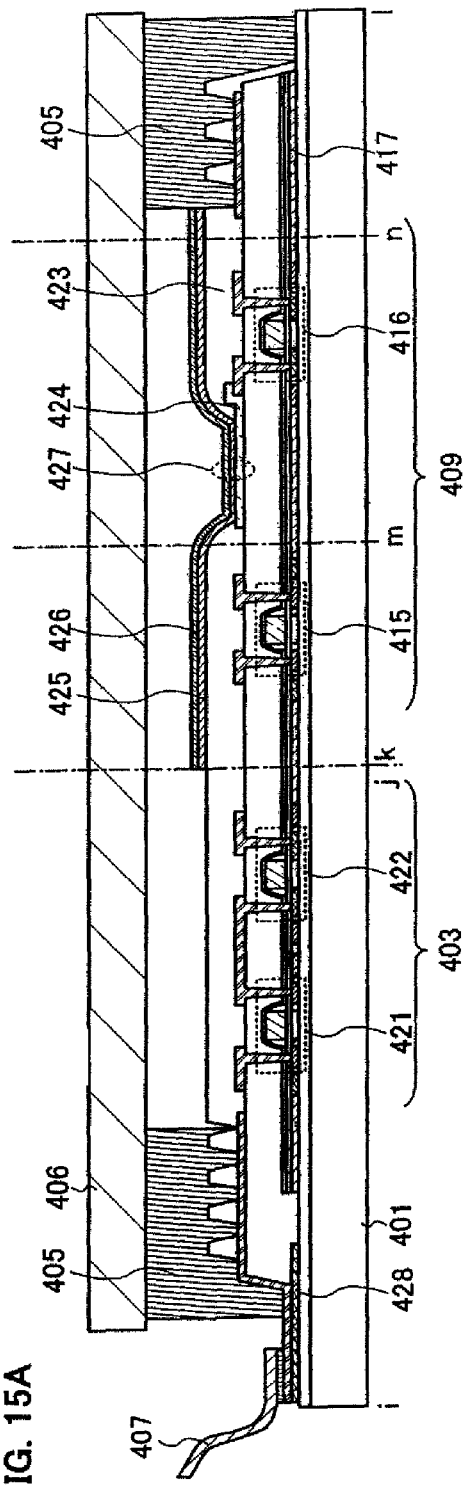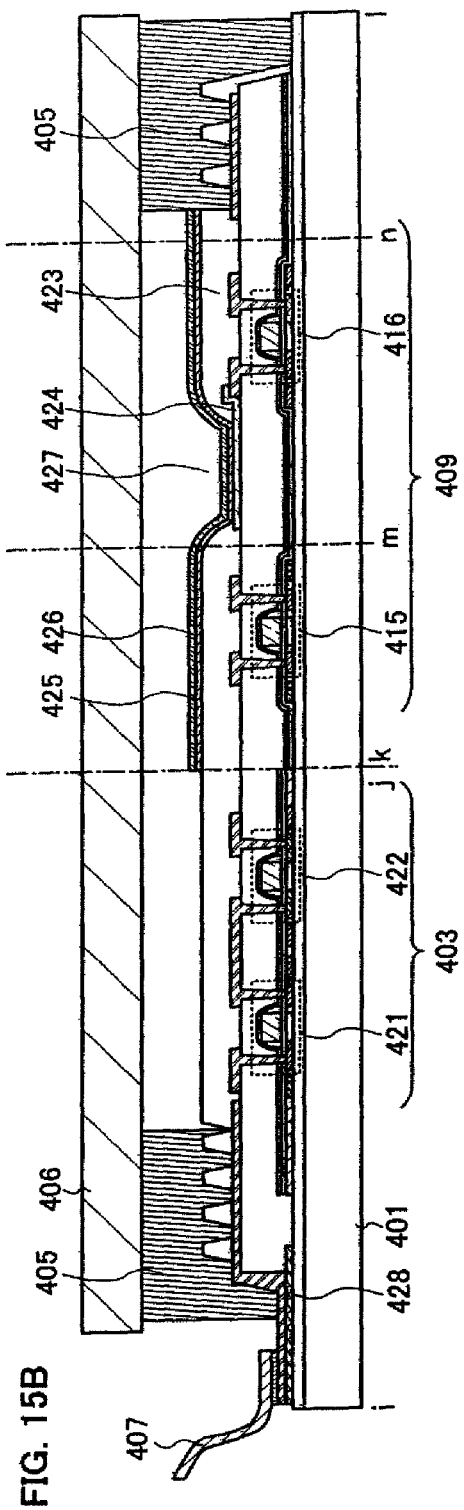

SEMICONDUCTOR DEVICE AND MANUFACTURING METHOD OF THE SAME

BACKGROUND OF THE INVENTION

1. Field of the Invention

The present invention relates to a semiconductor device preventing a poor connection or the like caused by a step or the like in a case that a conductive film and an insulating film, or a semiconductor film or the like are stacked, and a manufacturing method of the semiconductor device.

2. Description of the Related Art

In recent years, thin film transistors (TFTs) have been formed over a substrate having insulating surfaces, such as glass substrates, and semiconductor devices which use the thin film transistors as switching elements or the like are manufactured actively. The thin film transistors are formed so that island-shaped semiconductor films are formed over substrates having insulating surfaces by using CVD, etching or the like, and the island-shaped semiconductor films are used as channel regions of transistors. (for example, Patent Document 1: Japanese patent Laid-Open No. Hei 08-018055)

A general manufacturing method of a thin film transistor is shown in FIG. 17A to 17E. First, a semiconductor film 950 is formed over a substrate 951 with an insulating film 957 which functions as a base film therebetween (FIG. 17A). Next, the semiconductor film 950 is removed selectively and island-shaped semiconductor films 955 are formed (FIG. 17B), and a gate insulating film 956 is formed to cover the island-shaped semiconductor films 955 (FIG. 17C). Gate electrodes 953 are formed selectively over the island-shaped semiconductor films 955 with the gate insulating film 956 therebetween (FIG. 17D). Then, an n-channel thin film transistor 952a and a p-channel thin film transistor 952b are formed by forming insulating films (side walls) so as to contact with side surfaces of the gate electrodes and introducing an impurity element which shows a p-channel or an n-channel selectively or forming a source region, a drain region and an LDD region (FIGS. 17E and 18A).

Thus, the thin film transistor can be formed over the substrate through a process shown in FIGS. 17A to 17E. FIGS. 17A to 17E shows a cross-sectional structure between a-b of FIG. 18A.

[Patent Document 1]
Japanese patent Laid-Open No. Hei 08-018055

SUMMARY OF THE INVENTION

However, when the island-shaped semiconductor films 955 are formed selectively by etching the semiconductor films 950 formed over the substrate 951 and a film thickness of the gate insulating film 956 provided to cover the island-shaped semiconductor film 955 is not enough, the gate insulating film 956 sometimes cannot sufficiently cover the semiconductor film 955 due to steps of end portions of channel regions 954a and 954b in the semiconductor film 955 (FIGS. 18B to 18D). Accordingly, for example, when the gate electrodes 953 are formed over the semiconductor films 955 with the gate insulating film 956, a short circuit therebetween sometimes occurs by contacts of the gate electrode 953 formed over the gate insulating film 956 with the end portions of the channel region 954a and 954b of the semiconductor film 955 by a break of the gate insulating film 956 in the end portions of the channel region 954a and 954b of the semiconductor film 955 (FIG. 18C). In addition, a problem that a characteristic of the transistor is affected by a leakage current in the gate electrode 953 and the end portions of the channel regions 954a and 954b of the semiconductor film 955 (FIG. 18D) by thinning the gate insulating film 956 in the end portions of the channel regions 954a and 954b of the semiconductor film 955.

The present invention has been made in view of the problems described above, it is an object of the present invention to provide a semiconductor device where a short circuit between a semiconductor film and a gate electrode which is occurred by a disconnection or thin thickness of a gate insulating film in end portions of a channel region of a semiconductor film or a leakage current, and a manufacturing method of the semiconductor device.

The present invention takes a method shown below to accomplish the above object.

A semiconductor device of the present invention includes a semiconductor film provided continuously over a substrate; conductive films provided over the semiconductor film with a gate insulating film therebetween. The semiconductor device includes plural thin film transistors having source and drain regions formed in the regions of the semiconductor film which do not overlap the conductive films, and channel regions in the semiconductor film existing under the conductive films; and impurity regions provided in the semiconductor film which are not overlapped with the conductive films and provided adjacent to the source regions and drain regions, wherein the conductive films are provided over the channel regions and the regions of the semiconductor film which are provided adjacent to the channel regions. Note that in the present invention, the phrase, "the semiconductor film provided continuously" means a semiconductor film which is formed in a whole region in a region where plural thin film transistors are formed instead of providing a semiconductor film, and separating the semiconductor film into semiconductor films with island-shape for each thin film transistor. In addition, the term "a whole region" is always not the entire surface of the substrate, it is acceptable as long as each of plural thin film transistors uses a part of the same semiconductor film as a channel region.

In addition, in the above structure of the present invention, the thin film transistor has side walls provided contacting with side surfaces of a gate electrode, and it is possible to use with a structure which is provided with LDD regions in a semiconductor film which exist under the side wall.

In the above structure of the present invention, when the thin film transistor is an n-channel thin film transistor, the impurity region has p-type conductivity. When the thin film transistor is a p-channel thin film transistor, the impurity region has n-type conductivity.

Another structure of a semiconductor device of the present invention has a semiconductor film provided continuously over a substrate; a conductive film provided over the semiconductor film with a gate insulating film therebetween. The semiconductor device includes plural thin film transistors having source and drain regions formed in regions of the semiconductor film which do not overlap the conductive films and channel regions which are regions of semiconductor film existing under the conductive film and formed adjacent to the source region and drain regions; and first impurity regions provided in the semiconductor film which are not overlapped with the conductive films and provided adjacent to the source regions and drain regions; and second impurity regions provided in the semiconductor film which are formed adjacent to the outside of the first impurity region, wherein the conductive films are provided over the channel regions and regions of the semiconductor film which are provided adjacent to the channel regions. In addition, the thin film transistors can have a structure in which side walls provided in contact with side surfaces of the gate electrodes, and LDD regions are provided in the semiconductor film which exist under the side walls.

In the above structure of the present invention, the concentration of the impurity element added to the first impurity regions is equal to the concentration of the impurity element added to the LDD regions of the thin film transistors.

In the above structure of the present invention, when the thin film transistors are an n-channel thin film transistor, the first impurity regions have n-type conductivity and the second impurity regions have p-type conductivity.

In the above structure of the present invention, when the thin film transistors are p-channel thin film transistors, the first impurity regions have n-type conductivity and the second impurity regions have n-type conductivity. Further, the concentration of the impurity element added to the first impurity region is lower than the concentration of the impurity element added to the second impurity region.

In the above structure of the present invention, the channel regions of the plural thin film transistors are provided in the semiconductor film formed continuously.

A manufacturing method of the semiconductor device of the present invention comprising the steps of forming a semiconductor film over a substrate; forming a first impurity region selectively in the semiconductor film; forming a gate insulating film over the semiconductor film; forming a gate electrode selectively over a region of the semiconductor film which to be the channel region of the thin film transistor with the gate insulating film therebetween; forming selectively a first resist to cover a portion of the gate electrode and a portion of the semiconductor film; forming a first impurity region in the semiconductor film by adding a first impurity element selectively to the semiconductor film using the first resist as a mask; removing the first mask and forming a second impurity region selectively in the semiconductor film by adding a second impurity element selectively to the semiconductor film using the gate electrode as a mask; forming side walls so as to be in contact with the sides of the gate electrode; forming a second resist selectively to cover a portion of the gate electrode or the semiconductor film; forming a third impurity region selectively in the semiconductor film by adding a third impurity element selectively to the semiconductor film using the second resist as a mask; forming an insulating film to cover the gate electrode and the gate insulating film; and forming a conductive film which is electrically connected with the semiconductor film over the insulating film.

In the above structure of the present invention, an impurity element which shows p-type conductivity is used as a first impurity element, and an impurity element which shows n-type conductivity is used as a second impurity element and a third impurity element. Further, a concentration of the second impurity element is lowered than that of the third impurity element.

In an end portion of a channel region of a thin film transistor included in a semiconductor device, a break and a defective coverage of a gate insulating film in an end portion of a channel region are prevented, and a generation of a short circuit or a leakage current between a semiconductor film and a gate electrode provided over the semiconductor film with the gate insulating film therebetween can be prevented.

BRIEF DESCRIPTION OF THE DRAWING

FIGS. 10A to 10C show one example of a manufacturing method of the semiconductor device of the present invention;

FIGS. 11A and 11B show one example of a manufacturing method of the semiconductor device of the present invention;

FIGS. 15A and 15B show one example of a semiconductor device of the present invention;

DETAILED DESCRIPTION OF THE INVENTION

Figure 1A:
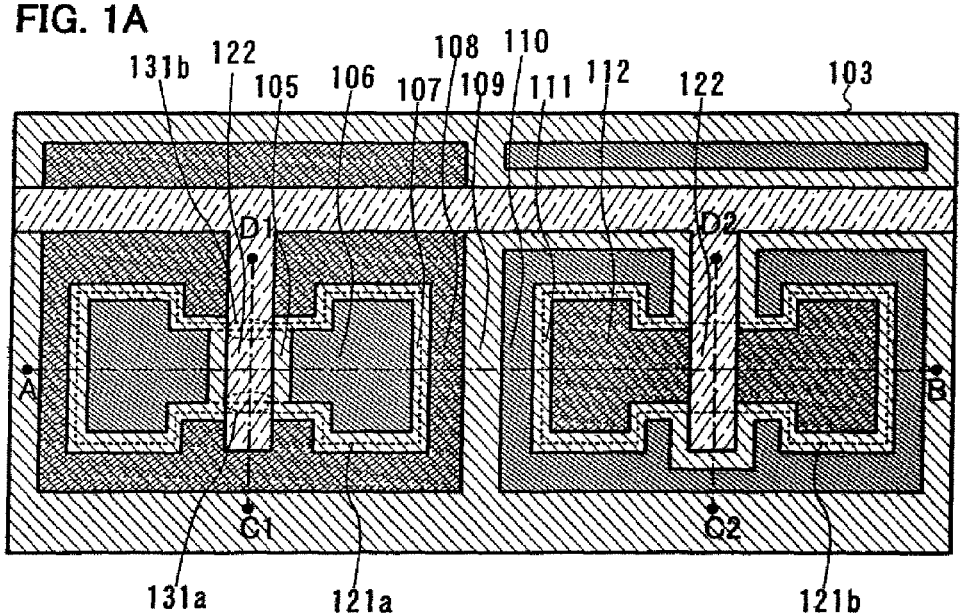
FIGS. 1A to 1D show one example of a semiconductor device of the present invention.

Embodiment Modes of the present invention are hereinafter described in detail with reference to the drawings. However, the present invention is not limited to the following description, and it is to be understood by those skilled in the art that the mode and detail of the present invention can be changed variously within the scope of the present invention. Therefore, the present invention should not be construed as being limited to the description of the following Embodiment Modes and Embodiments. Further, in the structures of the present invention hereinafter described, the same parts are denoted with the same reference numerals throughout the drawings.

Embodiment Mode 1

In this embodiment mode, an example of the semiconductor device of the present invention is described with reference to drawings.

Figure 1B:
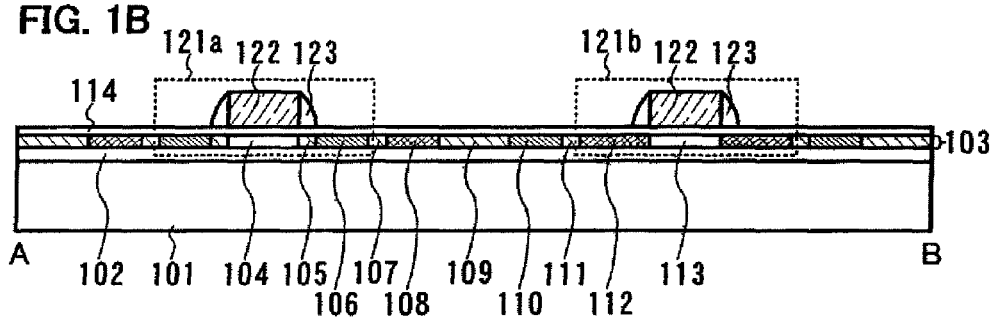
Figure 1C:
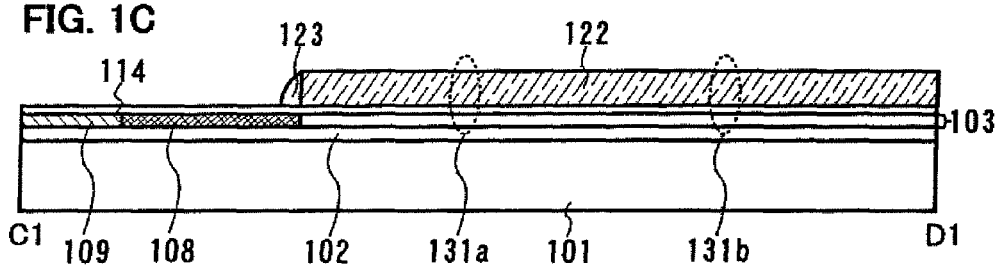
Figure 1D:
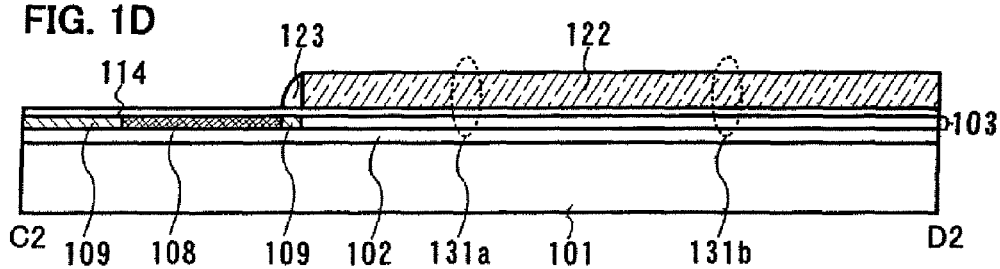

A schematic view of the semiconductor device shown in this embodiment mode is shown in FIGS. 1A to 1C. Note that FIG. 1B corresponds to a sectional view taken along A-B of FIG. 1A, FIG. 1C corresponds to a sectional view taken along C1-D1 of FIG. 1A, FIG. 1D corresponds to a sectional view taken along C2-D2 of FIG. 1A.

The semiconductor device of this embodiment mode has a semiconductor film 103 provided continuously over a substrate 101 with an insulating film 102 therebetween, gate electrodes 122 provided over the semiconductor film 103 with a gate insulating film 114 therebetween, and side walls 123 provided in contact with side surfaces of the gate electrodes 122. Then, thin film transistors (TFT) 121a and 121b which use parts of the semiconductor film 103 as channel regions are formed (FIGS. 1A and 1B). The gate insulating film 114 can be formed by oxidizing or nitriding the semiconductor film 103 by performing plasma treatment (hereinafter, referred to as "highly dense plasma treatment") using radio frequency to the semiconductor film 103 under the conditions of high density (preferably, a range of $1\times10^{11}$ cm$^{-3}$ to $1\times10^{13}$ cm$^{-3}$) and low electron temperature (preferably, a range of 0.5 eV to 1.5 eV). Alternatively, after an insulating film is formed by CVD, sputtering or the like, a surface of the insulating film can be made denser by oxidizing or nitriding the surface of the insulating film by performing highly dense plasma treatment to the gate insulating film 114 in an oxygen atmosphere or a nitrogen atmosphere. In addition, the insulating film 102 can be formed in the same manner by performing highly dense plasma treatment to the substrate 101.

Note that the semiconductor film provided continuously is not a semiconductor film where thin film transistors are provided separately by forming a semiconductor film with an island shape or the like but the semiconductor films where the thin film transistors are provided in a whole region. For example, in general, when plural thin film transistors are provided over a substrate, by removing the semiconductor film formed over the substrate selectively and forming the island shapes or the like, the island-shaped semiconductor films are used as channel regions of each thin film transistor. However, in this embodiment mode, the semiconductor film is shared as channel regions of plural thin film transistors without separating the semiconductor film provided over the substrate into the island-shapes or the like. FIGS. 1A to 1C show an example in which the semiconductor film 103 is used as channel regions of an n-channel thin film transistor 121a and a p-channel thin film transistor 121b which is formed adjacent to the n-channel thin film transistor 121a. In addition, a whole region is not always limited to a whole region of a substrate, but a case that the semiconductor film is formed in a certain region of a substrate and the semiconductor film is used to be shared as channel regions of plural thin film transistors is also included. A case that the semiconductor films are provided in plural regions of the substrate, and each semiconductor film is used as channel regions of plural thin film transistors is also included.

In a region where the n-channel thin film transistor 121a is provided, the semiconductor film 103 has a channel region 104 formed under the gate electrode 122, n-type low concentration impurity regions 105 which are formed under the side walls 123 and provided adjacent to the channel region 104, and an n-type high concentration impurity regions 106 which are provided adjacent to the low concentration impurity regions 105. The low concentration impurity regions 105 is referred to as an LDD (Lightly Doped drain) region, and the high concentration impurity region 106 is referred to as a source or drain region. For convenience, an n-type low concentration impurity region is referred to as n$^-$, an n-type high concentration impurity region is referred to as n$^+$.

Meanwhile, in a region where the p-channel thin film transistor 121b is provided, the semiconductor film 103 has a channel region 113 formed under the gate electrode 122 and p-type high concentration impurity regions 112 provided in contact with the channel region 113. The high concentration impurity region 112 is also referred to as a source or a drain region. For convenience, a p-type low concentration impurity region is referred to as p$^-$, and a p-type high concentration impurity region is referred to as p$^+$.

Generally, when plural thin film transistors are provided over a substrate, separation of elements is performed by a semiconductor film is formed over the substrate and island-shaped semiconductor films are formed by removing the semiconductor film selectively, and the island-shaped semiconductor films are used as channel regions of the thin film transistors. Meanwhile, in the semiconductor device shown in this embodiment mode, since the semiconductor film 103 provided continuously is shared as the channel regions of the plural thin film transistors, separation of the plural thin film transistors is performed by pn junction.

When separation of elements is performed by pn junction, it is necessary to introduce an impurity element twice at least in order to introduce an n-type impurity element and a p-type impurity element. In addition, when an impurity element is introduced, introduction of the impurity element has to be performed with considering accuracy of alignment. Consequently, when accuracy of alignment is not enough, and an n-type region and a p-type region are provided to overlap, resistance of an overlapped region becomes high and as a result, there is the possibility that the width of the channel of the thin film transistor or the like is changed by the width of the source, drain region or the like is narrowed.

Therefore, a buffering region which is formed of an n-type or a p-type low concentration impurity region is provided between the p-type high concentration impurity region and the n-type high concentration impurity region in consideration of accuracy of alignment. In this embodiment mode, an n-type low concentration impurity region is formed as a buffering region since an n-type low concentration impurity region which functions as an LDD region in an n-channel thin film transistor is formed.

The n-channel thin film transistor 121a is not affected by other thin film transistors such as the adjacent p-type thin film transistor 121b since junction with an n$^+$ region, an n$^-$ region and a p$^+$ region, namely, an n-type low concentration impurity region 107 provided adjacent to the n-type high concentration impurity region 106 and a p-type high concentration impurity region 108 provided adjacent to the low concentration impurity region 107, are formed in this order. In other words, the n-channel thin film transistor 121a is separated from other elements by the n-type low concentration impurity region 107 provided adjacent to the n-type high concentration impurity region 106, which functions as a source or drain region, and the p-type high concentration impurity region 108. Note that in FIGS. 1A to 1C, elements are separated by junction of the n$^+$ region and the n$^-$ region, the n$^-$ region and a p$^+$ region in this order since LDD regions in the n-channel thin film transistor 121a is formed. However, when the LDD regions are not formed or when the LDD regions are formed in the p-channel thin film transistor 121b, separation of elements can be performed by junctions of the n$^+$ region and the n$^-$ region, the n$^-$ region and the p$^+$ region.

Meanwhile, since a junction of a p$^+$ region and an n$^-$ region and a junction of the n$^-$ region and an n$^+$ region are formed in this order by an n-type low concentration impurity region 111 provided adjacent to the p-type high concentration impurity region 112 and an n-type high concentration impurity region 110 provided in contact with the low concentration impurity region 111, the p-channel thin film transistor 121b is not affected by other thin film transistors such as the n-channel thin film transistor 121a. In other words, as for the p-channel thin film transistor 121b, separation of elements is performed by the n-type low concentration impurity region 111 provided adjacent to a p-type high concentration impurity region 112 which functions as a source or drain region and an n-type high concentration impurity region 110. Note that, in FIGS. 1A to 1C, separation of elements is preformed by the junction of the p$^+$ region and n$^-$ region and the junction of the n$^-$ region and the n$^+$ region in the p-channel thin film transistor 121b in order to form LDD regions in the n-channel thin film transistor 121a. However, when LDD regions are not formed or LDD regions are formed in the p-channel thin film transistor 121b, separation of elements can also be performed by a junction of a p$^+$ region and a p$^-$ region, the p$^-$ region and an n$^+$ region.

In addition, in the semiconductor device as shown in this embodiment mode, since a semiconductor film is formed continuously, a defective coverage such as a break or thin thickness which is occurred by a step of the semiconductor film can be prevented in end portions of the channel regions of the thin film transistor 131a and 131b. Therefore, a short circuit or a leakage current between the semiconductor film 103 and the gate electrode 122 can be prevented (FIG. 1C).

FIGS. 1A to 1C have structures that the low concentration impurity region 107 is provided between the n-type high concentration impurity region 106 and the p-type high concentration impurity region 108, and the low concentration impurity region 111 is provided between the p-type high concentration impurity region 112 and the n-type high concentration impurity region 110 allowing for accuracy of alignment in the case of introducing an impurity element. However, when accuracy of alignment in introducing an impurity element in a manufacturing process or the like does not become a problem, the n-type high concentration impurity region 106 is provided adjacent to the p-type high concentration impurity region 108, and separation of elements can also be performed by a junction of a p$^+$ region and an n$^+$ region.

Next, an example of the manufacturing method of the semiconductor device of the present invention is described hereinafter with reference to drawings.

Figure 2A:
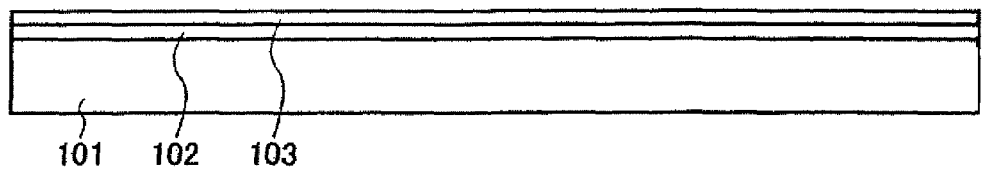
FIGS. 2A to 2D show one example of a manufacturing method of a semiconductor device of the present invention.

First, the semiconductor film 103 is formed over the substrate 101 with the insulating film 102 therebetween and a crystallization of the semiconductor film 103 is performed (FIG. 2A). As crystallization method of the semiconductor film 103, a laser crystallization method, a thermal crystallization method using RTA or a furnace annealing method, a thermal crystallization method using a metal element promoting crystallization, and a combined method of a thermal crystallization method using a metal element promoting crystallization and a laser crystallization method or the like can be used.

Figure 2B:
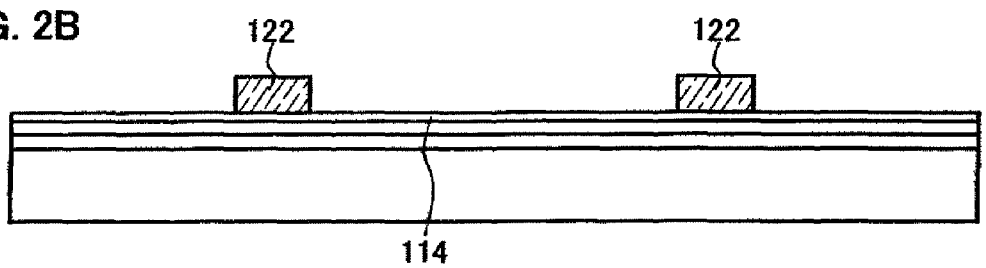

Next, the gate insulating film 114 is formed over the semiconductor film 103, and gate electrodes 122 are formed over the gate insulating film 114 (FIG. 2B).

Figure 2C:
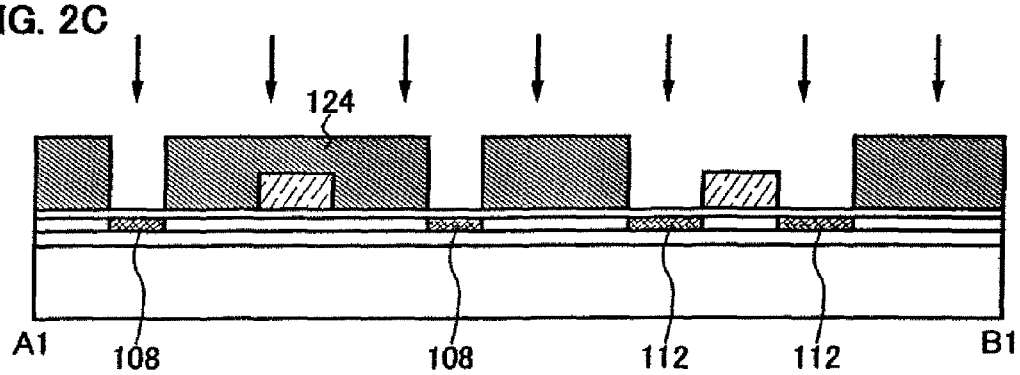
Figure 4A:
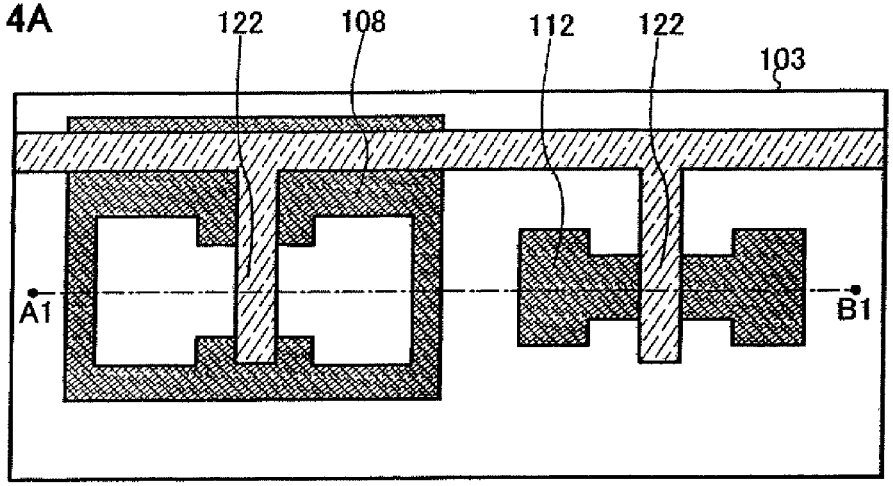
FIGS. 4A to 4C show one example of a manufacturing method of a semiconductor device of the present invention.

Next, a high concentration of an impurity element having p-type such as boron (B) is added in order to form a p-type impurity region in the semiconductor film 103. At this time, the p-type high concentration impurity regions 108 and 112 are formed in desirable positions by forming a resist 124 to be used as a mask previously over the semiconductor film 103 selectively, and then adding an impurity element providing p-type conductivity with a high concentration over the semiconductor film 103 (FIGS. 2C and 4A). Here, a cross-sectional view taken along A1-B1 of FIG. 4A corresponds to FIG. 2C.

Figure 2D:
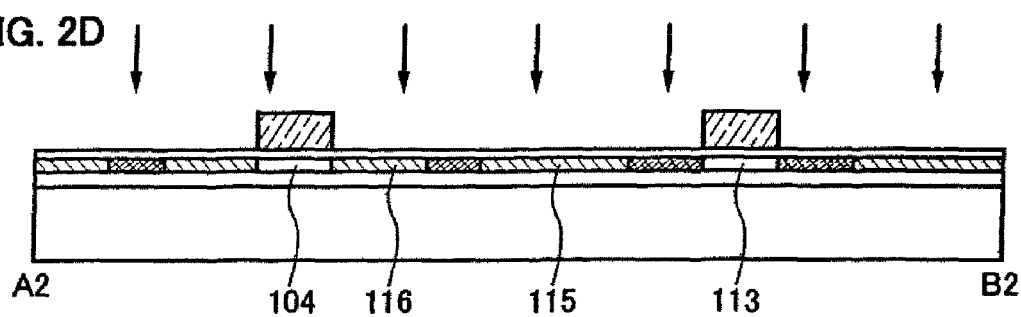
Figure 4B:
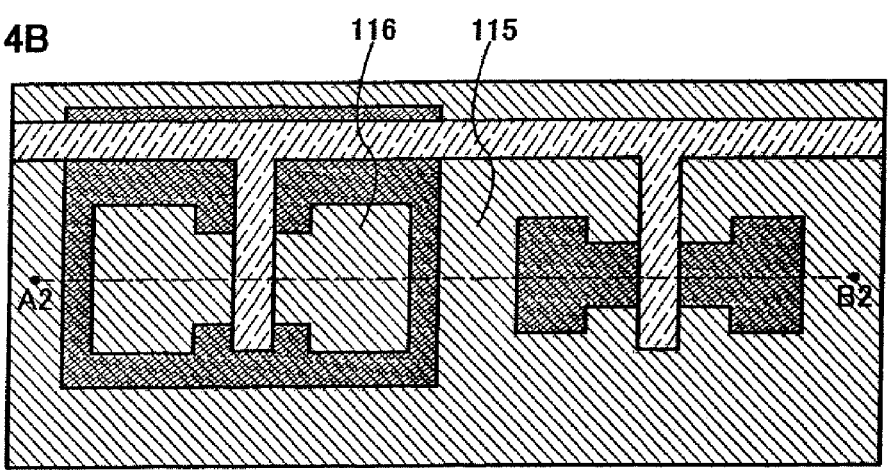

N-type low concentration impurity regions 115 and 116 are formed by adding a low concentration of an impurity element providing n-type conductivity such as phosphorus (P) into the semiconductor film 103 (FIGS. 2D and 4B). Here, since the gate electrodes 122 function as masks, the impurity element is not added into the regions of the semiconductor film 103 which exist under the gate electrodes 122. In addition, even when the impurity element is added with a low concentration to the high concentration impurity regions 108 and 112, the high concentration impurity regions 108 and 112 show p-type conductivity since a large amount of the p-type impurity element is added to the high concentration impurity regions 108 and 112. Note that, here, a cross-sectional view taken along A2-B2 of FIG. 4B corresponds to FIG. 2D.

Figure 3A:
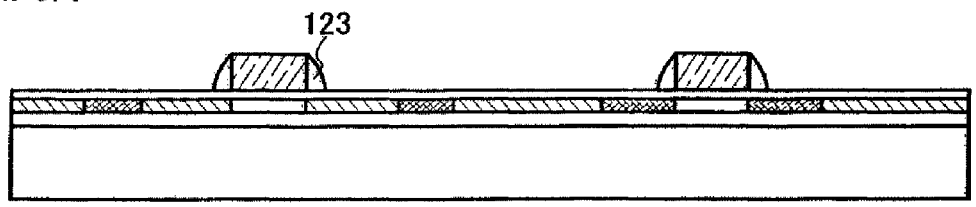
FIGS. 3A to 3D show one example of a manufacturing method of a semiconductor device of the present invention.

Side walls 123 are formed so as to contact with the sides of the gate electrodes 122 (FIG. 3A). For example, after forming an insulating film to cover the gate electrodes 122 and the gate insulating film 114, the side walls 123 may be formed on the sides of the gate electrodes 122 by removing the insulating film by anisotropic etching.

Figure 3B:
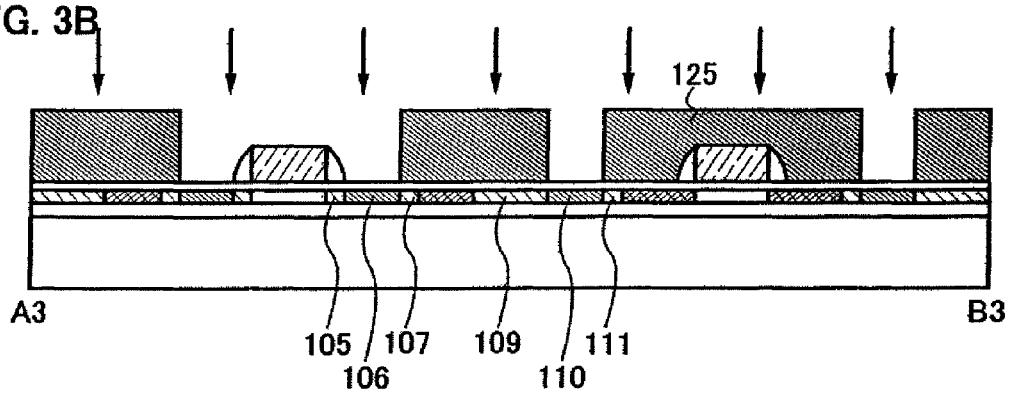
Figure 4C:
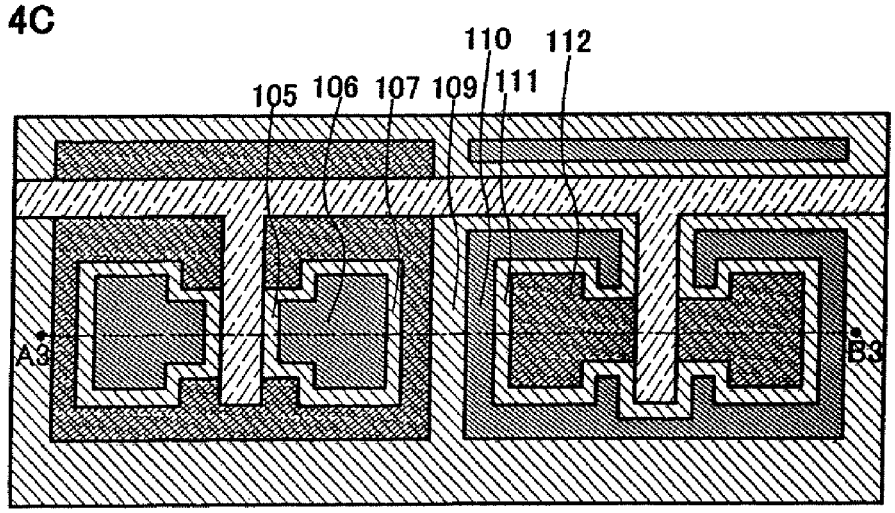

A high concentration of an impurity element providing n-type conductivity is added selectively in order to form the n-type high concentration impurity region in the semiconductor film 103. At this time, the n-type high concentration impurity regions 106 and 110 are formed in desirable positions by forming a resist 125 used as a mask previously over the semiconductor film 103 selectively, and adding an impurity element having n-type with a high concentration in the semiconductor film 103 from the upside thereof (FIGS. 3B and 4C). Here, a cross-sectional view taken along A3-B3 of FIG. 4C corresponds to FIG. 3B. In addition, the high concentration impurity region 106 corresponds to a source or drain region of the n-channel thin film transistor 121a, and the low concentration impurity region 105 corresponds to the LDD region of the n-channel thin film transistor 121a. The high concentration impurity region 112 corresponds to a source or drain region of the p-channel thin film transistor 121b.

Figure 3C:
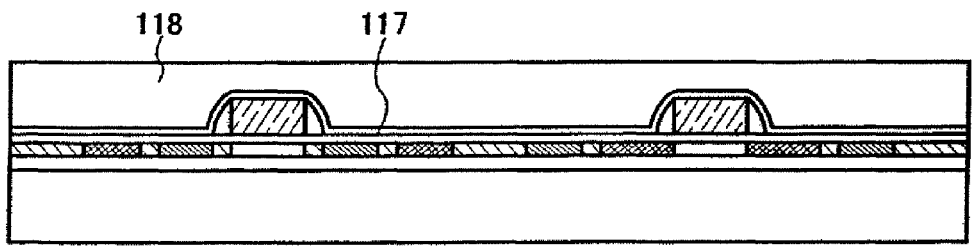

An insulating film 117 is formed to cover the gate insulating film 114, the gate electrodes 122 and the side walls 123. Further, an insulating film 118 is formed over the insulating film 117 (FIG. 3C).

Figure 3D:
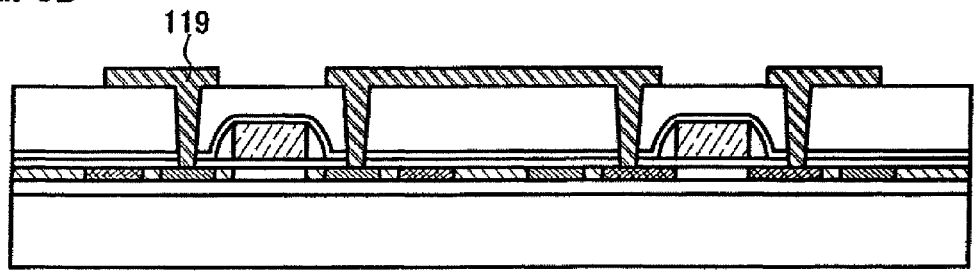

Opening portions are formed by removing the insulating films 117 and 118 and the gate insulating film 114 selectively. A conductive film 119 is formed over the insulating film 118 so as to be connected electrically with the high concentration impurity region having n-type conductivity 106 or the high concentration impurity region having p-type conductivity 112 (FIG. 3D).

The semiconductor device can be manufactured through the above process. Materials or the like in the above process will be specifically described below.

As the substrate 101, a glass substrate such as alumina borosilicate glass or barium borosilicate glass, a quartz substrate, a ceramic substrate, a metal substrate including stainless steel or the like can be used. In addition, a substrate formed from plastics typified by polyethylene terephthalate (PET), polyethylene naphthalate (PEN), or polyethersulfone (PES), or a synthetic resin having flexibility such as acrylic can be used. By using a flexible substrate, a foldable semiconductor device can be manufactured. Further, there is no limitation to the area or shape of the substrate when using such a substrate, and thus, a rectangular substrate having one side of 1 meter or more, for example, is used as the substrate 101, so as to enhance the productivity extremely. Such merit is great advantages as compared with a circular silicon substrate.

An insulating film 102 functions as a base film, and it is provided so as to prevent an alkali metal such as Na or an alkaline-earth metal from being dispersed into semiconductor films 103a and 103b from the substrate 101 and from influencing adversely on the characteristics of a semiconductor element. As the insulating film 102, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be employed. For example, when providing the insulating film 102 to have a two-layer structure, a silicon nitride oxide film as a first insulating film and a silicon oxynitride film as a second insulating film may be provided. When providing the insulating film 102 to have a three-layer structure, a silicon oxynitride film as a first insulating film, a silicon nitride oxide film as a second insulating film, and a silicon oxynitride film as a third insulating film may be provided. By providing the insulating film 102, when the glass substrate is used as the substrate 101, contamination of an impurity element or the like from the substrate 101 to the semiconductor film 103 can be prevented. When a fear of contamination or the like caused by mixture of an impurity element from a substrate 100 to the semiconductor film 103 of the like does not exist, it is not always necessary to form the insulating film 102.

When a laser crystallization method is used for the crystallization of the semiconductor film 103, a gas laser or a solid laser of a continuous oscillation or a pulsed oscillation is used. As the gas laser, an excimer laser, a YAG laser, a $YVO_4$ laser, a YLF laser, a $YAlO_3$ laser, a glass laser, a ruby laser, or a Ti: sapphire laser is used. As the solid laser, a laser using a crystal such as YAG, $YVO_4$, YLF, and $YAlO_3$ doped with Cr, Nd, Er, Ho, Ce, Co, Ti, or Tm is used. In particular, by irradiating a fundamental wave of the continuous oscillation laser, or a harmonic wave from second to fourth harmonic waves of the fundamental wave, large grain crystals can be obtained. For example, a second harmonic (532 nm) or a third harmonic (355 nm) of an Nd: $YVO_4$ laser (a fundamental wave of 1064 nm) can be used. It is to be noted that laser light of a fundamental wave of a continuous wave laser and laser light of a harmonic of a continuous wave laser may be irradiated, or laser light of a fundamental wave of a continuous wave laser and laser light of a harmonic of a pulsed laser may be irradiated. By irradiating a plurality of kinds of laser light, energy can be compensated. In addition, if a pulse oscillation laser oscillates the laser beam with a repetition rate for irradiating the next pulsed laser light until a semiconductor film which has been melted by the previous laser light is solidified, crystal grains grown continuously in the scanning direction can be formed. That is, a pulsed oscillation laser which can be used here has a repetition rate a lower limit of which is set such that the pulse repetition period is shorter than a period for solidifying completely the semiconductor film which has been melted. As such laser, pulsed oscillation laser light having a repetition rate of 10 MHz or more may be used.

As the gate insulating film 114, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be used.

As the gate electrode 122, a single layer structure or a multilayer structure of an element selected from tantalum (Ta), tungsten (W), titanium (Ti), molybdenum (Mo), aluminum (Al), copper (Cu), chromium (Cr), or niobium (Nb) or an alloy material or a chemical compound material mainly containing some of the elements can be used. In addition, a semiconductor material typified by polysilicon doped with an impurity element such as phosphorus can be used. For example, when the gate electrode is provided as a two-layer structure, a tantalum nitride (TaN) layer and a tungsten (W) layer, tungsten nitride (WN) layer and a tungsten layer, a molybdenum nitride (MoN) layer and a molybdenum (Mo) layer, or the like can be given as an example of a combination of a first conductive layer and a second conductive layer.

The side wall 123 can be provided with a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), a film containing carbon such as DLC (diamond like carbon), or further, an organic material such as epoxy, polyimide, polyamide, poly vinylphenol, benzocyclobutene, or acrylic, a siloxane resin.

The insulating film 117 can be provided with a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon).

The insulating film 118 can be provided with a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), a film containing carbon such as DLC (diamond like carbon), or further, an organic material such as epoxy, polyimide, polyamide, poly vinylphenol, benzocyclobutene, or acrylic, a siloxane resin.

As a conductive film 119, a single layer structure or a multilayer structure of an element selected from Al, Ti, W, Ni, C, Mo, Pt, Cu, Ta, Au, Mn or an alloy containing some of the elements can be used. For example, as the conductive film made of an alloy containing some of the elements, an Al alloy including C and Ti, an Al alloy including Ni, an Al alloy including C and Ni, an Al alloy including C and Mn, or the like can be used. In addition, in the case of the multilayer structure, Al and Ti can be stacked.

Figure 19A:
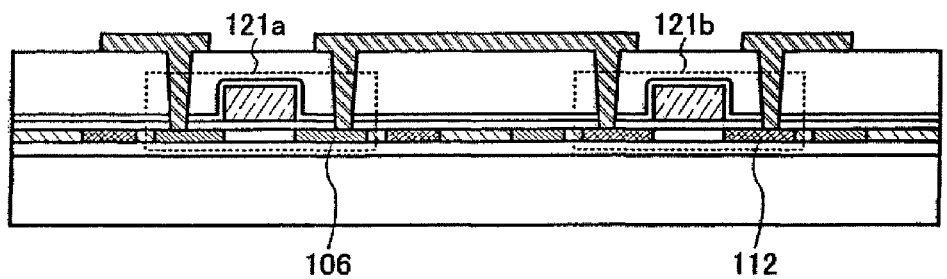
FIGS. 19A and 19B show one example of a semiconductor device of the present invention.
Figure 19B:
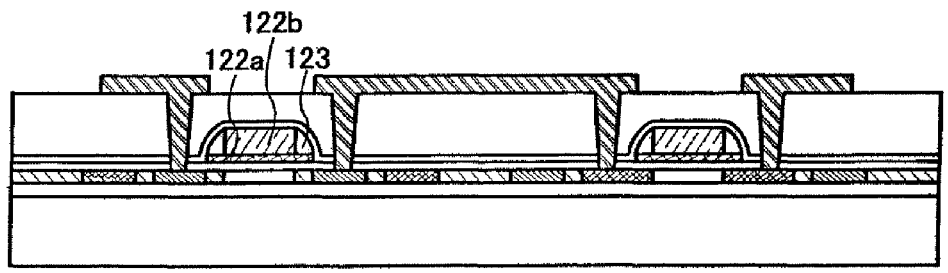

As the described above, this embodiment mode shows a case that the n-channel transistor 121a has the sidewalls 123 in contact with the sides of the gate electrode 122 and the n-type low concentration impurity regions 105 (LDD regions), which are provided under the side wall 123, and the n-type high concentration impurity regions 106. In addition, a p-channel transistor 121b has the sidewalls 123 in contact with the sides of the gate electrode and has the p-type high concentration impurity regions 112. However, the present invention is not limited to the above structure. For example, LDD regions can be provided in both the n-channel thin film transistor 121a and the p-channel thin film transistor 121b, as shown in FIGS. 19A and 19B, or neither LDD regions nor side walls may be provided in the n-channel thin film transistors 121a and the p-channel thin film transistors 121b. The structure of the transistor is not limited the above described structure, but a single gate structure having one channel region, a double gate structure having two channel regions or a triple gate structure having three channel regions may be adopted. Further, a bottom gate structure or a dual gate structure having two gate electrodes which are provided above and below the channel region with the gate insulating films therebetween may be employed. In addition, in a case where the gate electrode has a structure of plural conductive films stacked, the first conductive film 122a in the lower part of the gate electrode, and the second conductive film 122b formed in the upper part the first conductive film 122a are provided, and the side walls 123 are provided so as to contact with the sides of the second conductive film 122b and above the first conductive film 122a (FIG. 19B). In addition, in the above structure, the regions of the semiconductor film 103 functioning as the source and drain regions of the n-channel thin film transistor 121a and the p-channel thin film transistor 121b can be provided with silicide of Ni, Co, W, Ti or the like. Note that the semiconductor device of the present invention include all cases obtained by combining structures of the thin film transistor described above.

As described above, in the semiconductor device of this embodiment mode, since the semiconductor film formed continuously is commonly used as channel regions of plural thin film transistors, the thin film transistor can be provided so that a step is not generated in the semiconductor film of the channel region. Accordingly, a defective coverage such as a break or a thin thickness of the gate insulating film in the end portions of the channel regions of the thin film transistors re prevented, and a short circuit or a leakage current between the semiconductor film and the gate electrode provided over the semiconductor film with the gate insulating film therebetween can be prevented.

Embodiment Mode 2

In this embodiment mode, the semiconductor device which is different form the above embodiment mode is described with reference to drawings.

Figure 5A:
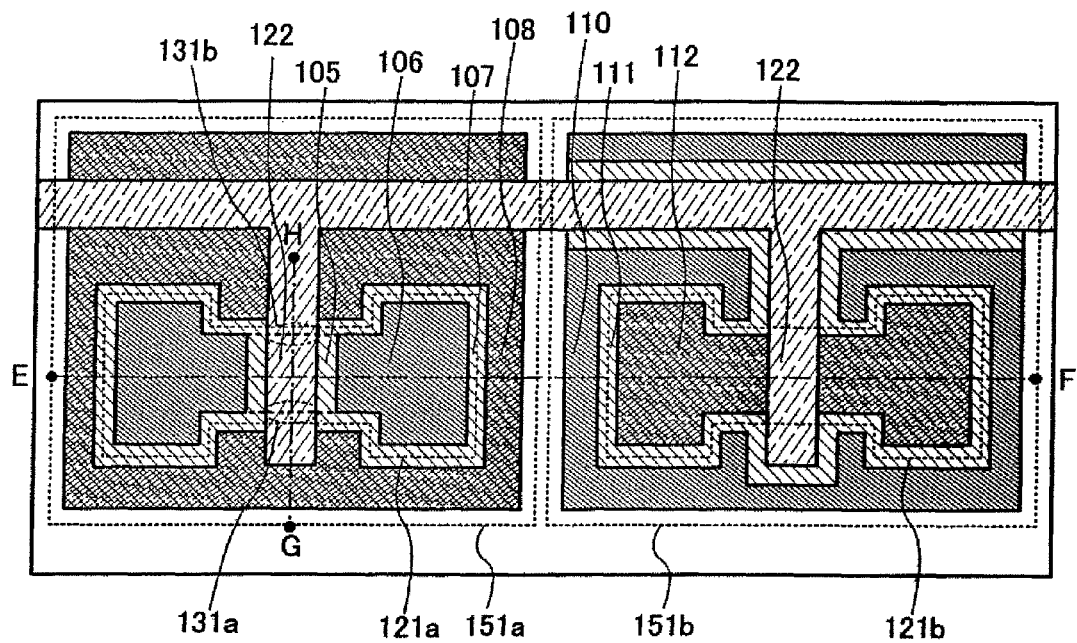
FIGS. 5A to 5C show one example of a semiconductor device of the present invention.
Figure 5B:
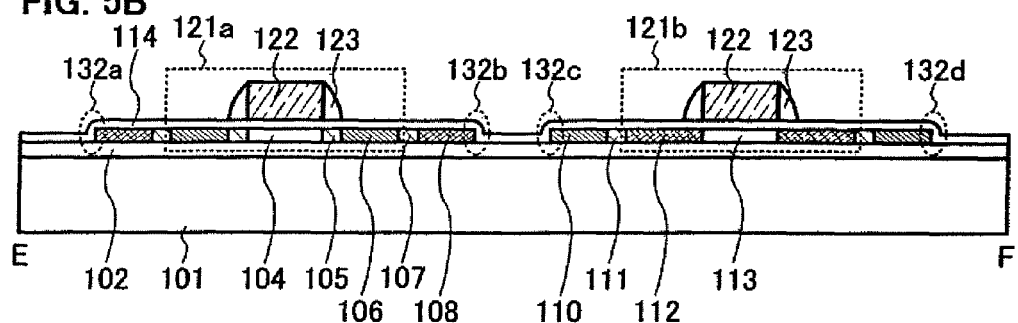
Figure 5C:
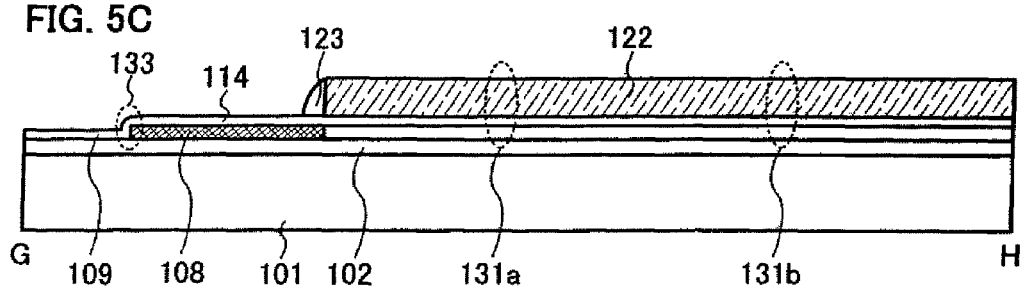

A schematic view of the semiconductor device shown in this embodiment mode is shown in FIGS. 5A to 5C. Note that FIG. 5B corresponds to a sectional view between E-F of FIG. 5A, and FIG. 5C corresponds to a sectional view between G-H of FIG. 5A.

The semiconductor device of this embodiment mode has plural semiconductor films 151a and 151b which are separated into an island shape, and the n-channel thin film transistor 121a and the p-channel thin film transistor 121b are formed in the semiconductor films 151a and 151b, respectively. In other words, in the Embodiment Mode 1, one semiconductor film is formed for each of the n-channel thin film transistor 121a and the p-channel thin film transistor 121b, thereby the channel regions of the n-channel thin film transistor 121a and the p-channel thin film transistor 121b are provided. In this embodiment mode, the semiconductor films 151a and 151b are provided separately, and the n-channel thin film transistor 121a and the p-channel thin film transistor 121b are formed in the semiconductor films 151a and 151b respectively (FIGS. 5A and 5B).

In FIGS. 5A to 5C, the n-channel thin film transistor 121a is formed in a region of the island-shaped semiconductor film 151a. In the n-channel thin film transistor 121a, the semiconductor film 151a has the channel region 104 formed under the gate electrode 122, the n-type low concentration impurity regions 105 formed under the side wall 123 and formed adjacent to the channel region 104, and the n-type high concentration impurity regions 106 provided adjacent to the n-type low concentration impurity region 105. In addition, as for the n-channel thin film transistor 121a, separation of elements is performed by a junction of an $n^+$ region and an $n^-$ region, and a junction of the $n^-$ region and a $p^+$ region formed in this order by the n-type low concentration impurity region 107 provided adjacent to the n-type high concentration impurity region 106 and the p-type high concentration impurity region 108 provided adjacent to the low concentration impurity region 107.

Meanwhile, the p-channel thin film transistor 121b is formed in the region of the island-shaped semiconductor film 151b. In the p-channel thin film transistor 121b, separation of elements is performed to the semiconductor film 151b by a junction of a $p^+$ region and an $n^-$ region, and a junction of the $n^-$ region and an $n^+$ region formed by the n-type low concentration impurity region 111 provided in contact with the p-type high concentration impurity region 112 and the n-type high concentration impurity region 110 provided in contact with the low concentration impurity region 111.

In the semiconductor device of this embodiment mode, after forming the semiconductor film over the substrate, the semiconductor film is removed selectively to form an island-shaped semiconductor film. The island-shaped semiconductor film is formed to be larger than a region in which the channel regions of the thin film transistors 121a and 121b are formed. In other words, the thin film transistors 121a and 121b are formed in the regions of the semiconductor films 151a and 151b respectively. Defective coverage of a gate insulating film in the end portions of the channel regions 131a and 131b can be prevented since the end portions of the semiconductor films 151a and 151b are not the end portions of the channel region 131a and 131b. Therefore, in the thin film transistors 121a and 121b, a short circuit or a leakage current which is occurred between the semiconductor film and the gate electrode can be suppressed.

Meanwhile, in the end portions 132a to 132d shown in FIG. 5B or the end portions of the semiconductor films 151a and 151b (the end portions 132a to 132d and 133) shown in FIG. 5C, there is a case that the defective coverage of the gate insulating film 114 occurs by a step of the end portions of the island-shaped semiconductor films 151a and 151b. However, since the thin film transistors 121a and 121b are separated by the junction of the $n^+$ region and the $n^-$ region, and the junction of the $n^-$ region and the $p^+$ region, and the junction of the $p^+$ region and the $n^-$ region, and the junction of the $n^-$ region and the $n^+$ region, even if the defective coverage of the gate insulating film 114 or the like occurs in the end portions of the semiconductor films 151a and 151b (the end portions 132a to 132d, and 133), the properties of the thin film transistors 121a and 121b are hardly affected.

Figure 6A:
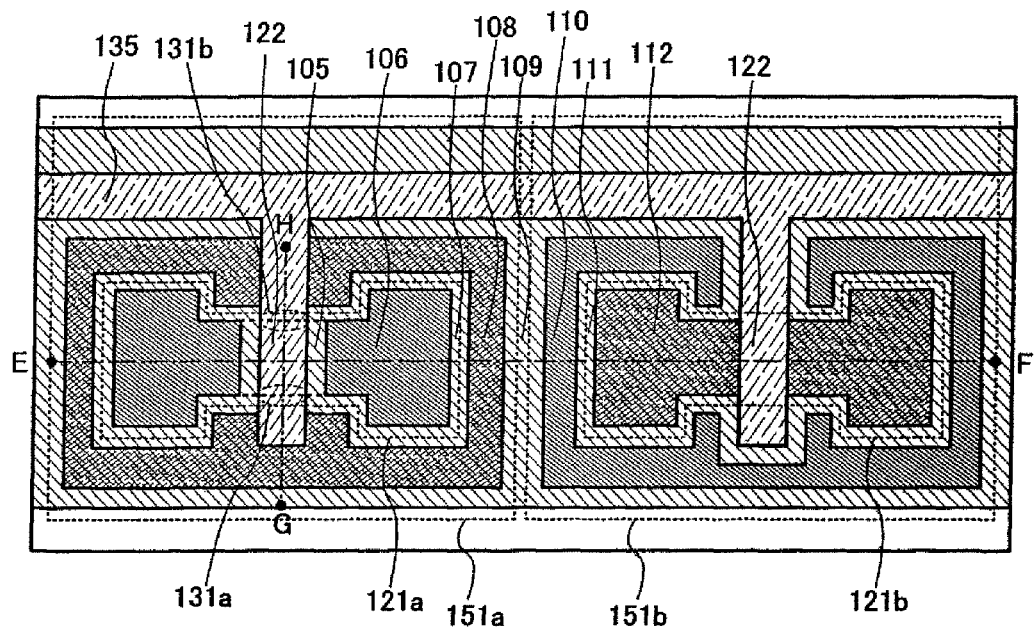
FIGS. 6A and 6B show one example of a semiconductor device of the present invention.
Figure 6B:
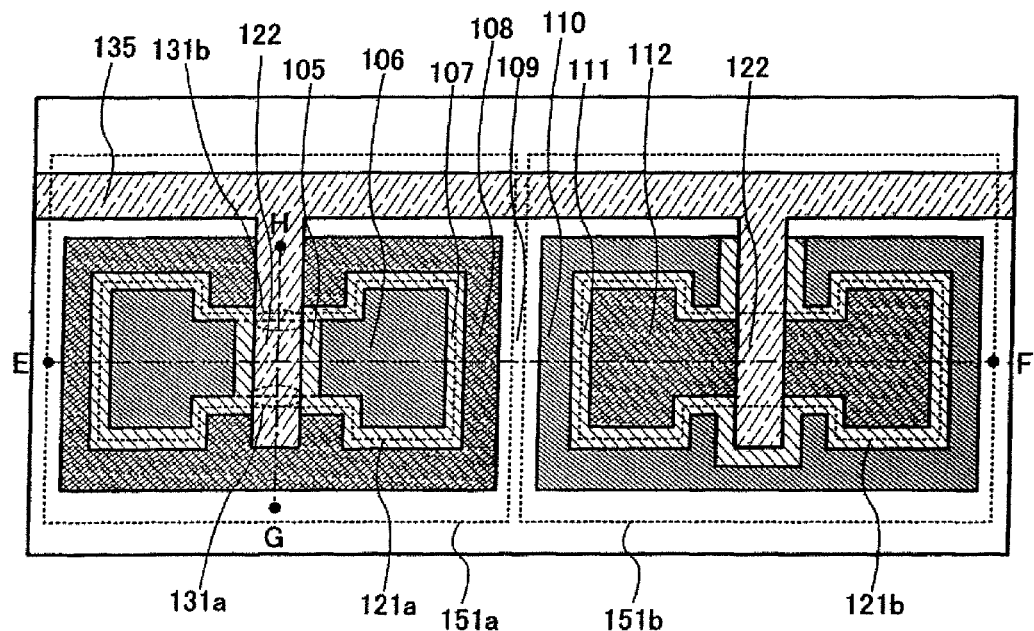

The structure of the semiconductor device of this embodiment mode is not limited the above structure but may have any structure, as long as a region of the semiconductor film which becomes an end portion of the channel region of the thin film transistor is provided so that the region of the semiconductor film does not have a step, the structure is not limited. For example, there can be employed a structure in which the semiconductor film is provided under the gate electrode 122 and a gate wiring 135 as shown in FIG. 6A, and the gate electrode 122 and the gate wiring 135 do not cross the end portion of the semiconductor film. A short circuit or the like between the semiconductor film and the gate electrode can be prevented by providing the semiconductor device with such a structure. In this case, the channel regions of the thin film transistors having the gate electrodes connected to the same gate wiring are formed by using the same semiconductor film. Besides, there may be adopted a structure in which the semiconductor films 151a and 151b are provided as small as possible, and the thin film transistors 121a and 121b may be provided in portions of the regions of the semiconductor films 151a and 151b. In this case, separation of elements is performed by a pn junction as described above so that a step does not occur in the end portions of the channel forming region of the thin film transistors 121a and 121b. When the thin film transistors are used as switching elements of pixels of a display device using a liquid crystal display device or a self-emission type light-emitting element by providing the thin film transistor with a structure shown in FIG. 6B, aperture ratio can be improved.

Note that this embodiment mode can be freely combined with the above Embodiment Mode 1.

Embodiment Mode 3

In this embodiment mode, a structure of the semiconductor device of the present invention which is different from that of the above embodiment mode is described with reference to drawings. Specifically, an example of a semiconductor device which can communicate data with non-contact is described.

Figure 7A:
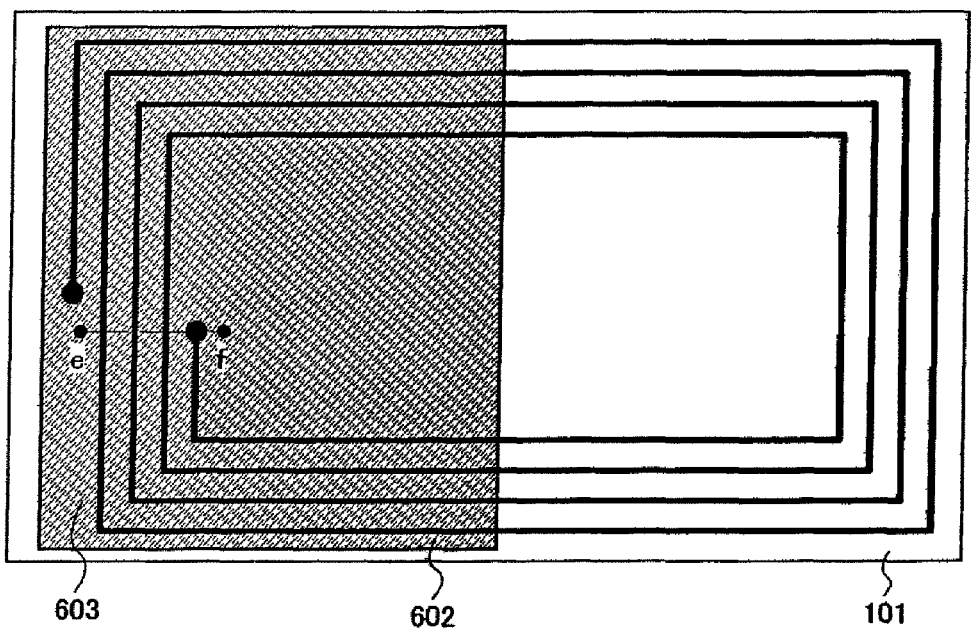
FIGS. 7A and 7B show one example of a semiconductor device of the present invention.

In the semiconductor device of this embodiment mode, an element group 603 having plural thin film transistors and a conductive film 602 which functions as an antenna are provided over a substrate 101 as shown in FIG. 7A. The conductive film 602 which functions as an antenna electrically connects with a thin film transistor included in the element group 603. In addition, the semiconductor device can communicate data with an external device (a reader/writer) by the conductive film 602 which functions as an antenna with non-contact.

Figure 7B:
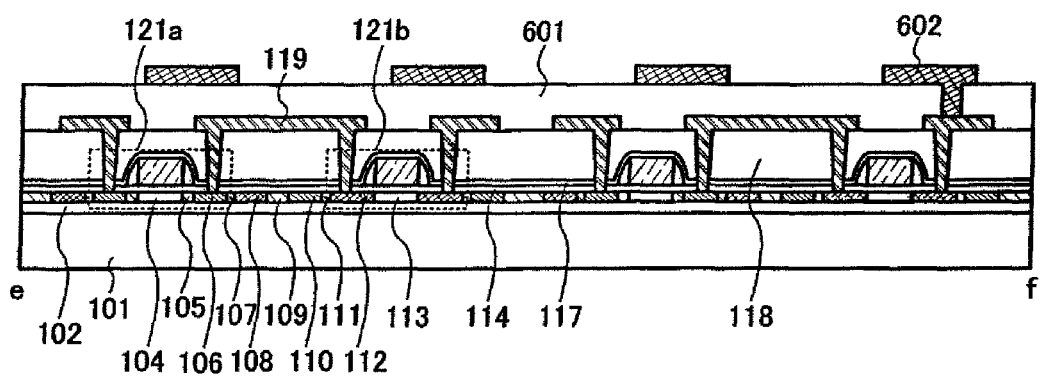

As shown in FIG. 7B, the conductive film 602 which functions as an antenna can be formed over an insulating film 601 formed to cover a conductive film 119 which is electrically connected with a source or drain region of the thin film transistor. Note that FIG. 7B corresponds to a cross-sectional view of FIG. 7A.

Figure 8A:
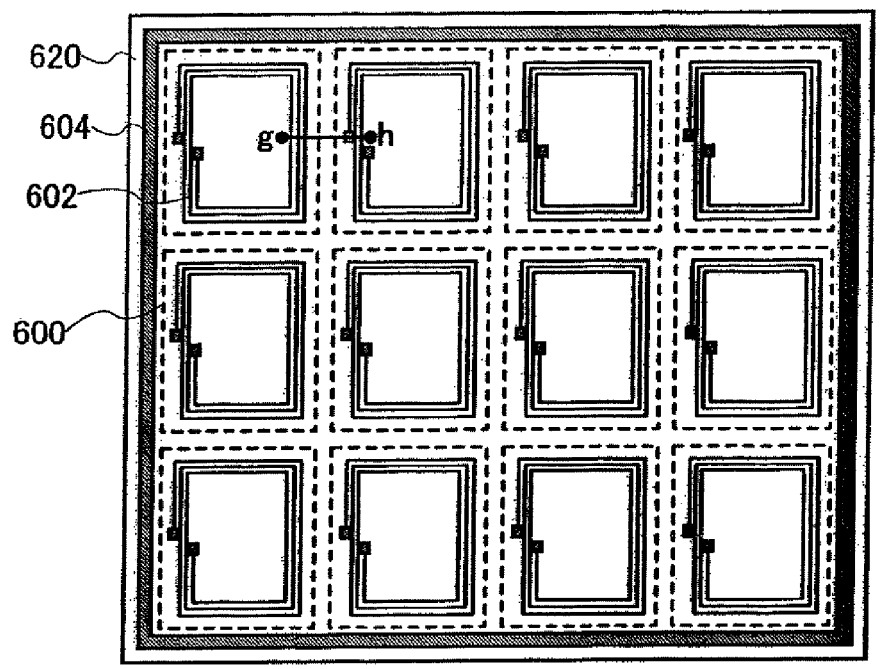
FIGS. 8A and 8B show one example of a manufacturing method of the semiconductor device of the present invention.

Hereinafter, an example of a manufacturing method of the semiconductor device is described with reference to drawings. In this embodiment mode, as shown in FIG. 8A, a case is described, that a plurality of semiconductor devices 600 (here, 12 pieces=4 deep×3 wide) is manufactured using one substrate 620. In addition, in order to form a flexible semiconductor device, once an element group such as thin film transistors, and an antenna are provided over a rigid substrate 620 such as glass through a separation layer 604, then, the element array and the antenna and the like are separated from the substrate 620, and the group of the elements, the antenna and the like are provided over a flexible substrate.

Figure 9A:
FIGS. 9A to 9D show one example of a manufacturing method of the semiconductor device of the present invention.
Figure 9B:
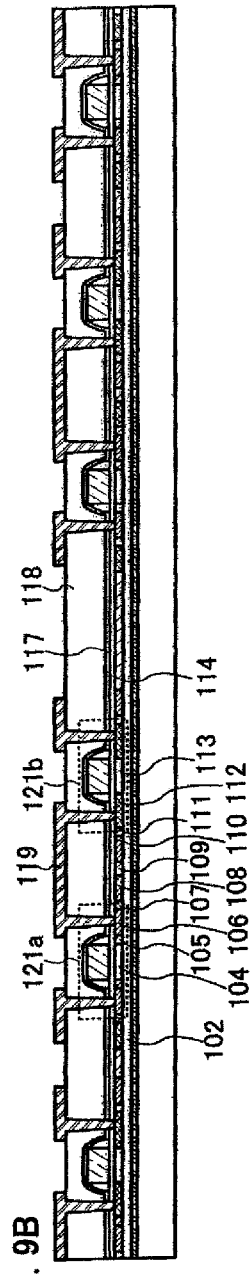

First, the separation layer 604 is formed over the substrate 620 (FIG. 9A). Before forming the separation layer 604, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) may be provided over the substrate 620 as a base film. Contamination by an impurity element or the like from the substrate 620 to the separation layer 604 can be prevented by providing such an insulating film as a base film.

Next, plural thin film transistors such as the n-channel thin film transistor 121a and the p-channel thin film transistor 121b, the conductive film 119 and the like are formed over the separation layer 604 similarly to FIGS. 2A to 2D and FIGS. 3A to 3D (FIGS. 9A to 9D). The n-channel thin film transistor 121a and the p-channel thin film transistor use the semiconductor film 103 as channel regions.

Figure 9C:
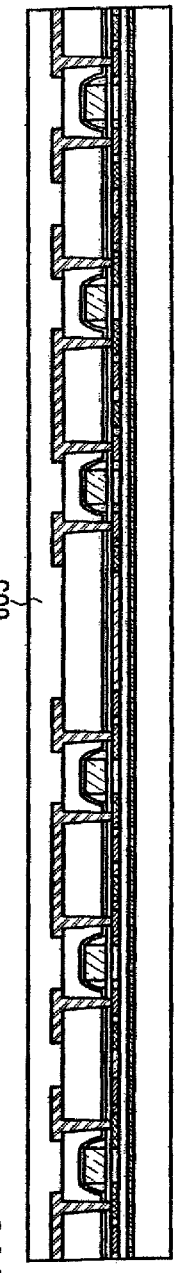

Then, an insulating film 605 is formed to cover the conductive film 119 (FIG. 9C).

Figure 9D:
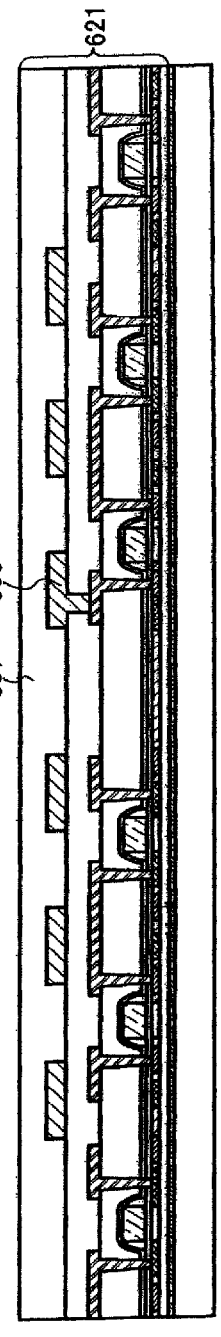

A conductive film 606 which functions as an antenna is formed over the insulating film 605 and an insulating film 607 is formed as a protection film to cover the conductive film 606 (FIG. 9D). The conductive film 606 which functions as an antenna is provided so as to electrically connect with the conductive film 119. Here, a stacked structure of a layer having a thin film integrated circuit and a layer having a conductive film which functions as an antenna is referred to as an element group 621.

The element group 621 is separated from the substrate 620. Here, an opening portion 609 is formed by removing the insulating film 102, the semiconductor film 103, the gate insulating film 114, and insulating films 117, 118, 605, and 607 selectively, the separation layer 604 is removed by introducing an etching agent through the opening portion 609 (FIG. 10A). The opening portion 609 is formed among plural semiconductor devices 600 (FIG. 8A). In addition, the opening portion 609 may be formed in the region of the semiconductor device other than the region where the thin film transistors are formed. In addition, the whole separation layer 604 may be removed or the separation layer 604 may be selectively removed to leave a portion, without removing the whole. By leaving a portion of the separation layer 604, even after the separation layer 604 is removed by the etching agent, the element group 621 can be held over the substrate 620, and the handling in a later step becomes simple and easy.

A first sheet material 610 having an adhesion property is bonded to the insulating film 607, and the element group 621 is removed from the substrate 620 (FIG. 10B). When the element group 621 is removed from the substrate 620, peeling may be performed without using an etching agent. For example, the opening portion 609 may be formed by removing the insulating film 102, the semiconductor film 103, the gate insulating film 114, the insulating films 117, 118, 605, and 607 selectively by laser irradiation. After that, the first sheet material 610 is bonded to the insulating film 607 and the element group 621 can be removed from the substrate 620 physically.

The removed element group is sealed with a film having a flexible property. Here, the element group 621 is sealed with a second sheet material 611 and a third sheet material 612 (FIG. 10C). A concrete example of sealing is shown in FIG. 11A. A surface of the element group 621 on the side from which the element group 621 is separated from the substrate 620 is bonded to the second sheet material 611, and the first sheet material 610 is separated. And then, the surface of the element group 621 on the side from which the element group 621 is separated from the first sheet material 610 is bonded to the third sheet material 612. At this time, semiconductor devices sealed by the second sheet material 611 and the third sheet material 612 can be sequentially formed by using a sealing roll 192 for performing one or both of heating treatment and pressurization treatment, a supplying roll 191 on which the third sheet material 612 is rolled, and a belt conveyer 190. Then, the semiconductor devices are completed by cutting the second sheet material 611 and the third sheet material 612 (FIG. 11B).

Materials of the above process are described specifically hereinafter.

As the separation layer 604, a metal film, a stacked structure of a metal film and a metal oxide film or the like can be used. As the metal film, a single layer structure or a multilayer structure of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), or iridium (Ir) or an alloy material or a chemical compound material mainly containing some of the elements can be used. In addition, such materials can be formed by a known method (a sputtering method or various CVD methods such as a plasma CVD method). As the stacked structure of a metal film and a metal oxide film, after forming the metal film, plasma treatment in an atmosphere including oxygen and a heat treatment in an atmosphere including oxygen are conducted to provide an oxide of the metal film in the surface of the metal film. For example, in the case that a tungsten film is formed by a sputtering method as the metal film, a plasma treatment is conducted to the tungsten film and a metal oxide film formed from tungsten oxide can be formed in the surface of the tungsten film. In addition, the tungsten oxide is expressed by $WO_x$, wherein "x" is 2 to 3, and there are a case where "x" is 2 ($WO_2$), a case where "x" is 2.5 ($W_2O_5$), a case where "x" is 2.75 ($W_4O_{11}$), and a case where "x" is 3 ($WO_3$), and the like. In forming the tungsten oxide, the value of "x" is not particularly limited, and which oxide is to be formed may be determined depending on an etching rate and the like. In addition to such metal oxide, a metal nitride or a metal oxynitride may be used. In this case, a plasma treatment or a heat treatment may be conducted to the above metal film in an atmosphere including nitrogen or in an atmosphere including nitrogen and oxygen. Plasma treatment may be performed under the conditions which are dense and a low electron temperature. Further, as another method, after forming such a metal film, an insulating film 203 is formed by a sputtering method in an atmosphere including oxygen, thereby providing the metal oxide film in the surface of the metal film. Moreover, after forming the metal film, it is also possible that sputtering is conducted using a metal as a target in an atmosphere including oxygen to a metal oxide film in the surface of the metal film. In this case, it is possible that the metal film and the metal oxide film can be formed different materials. Note that these methods are preformed in the atmosphere including nitrogen or the atmosphere including nitrogen and oxygen by a sputtering method, thereby forming a metal nitride film or a metal oxynitride film over the metal film.

As the insulating films 605 and 607, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon), further, an organic material such as epoxy, polyimide, polyamide, poly vinylphenol, benzocyclobutene, or acryl, can be used. In particular, organic materials such as epoxy, polyimide, polyamide, poly vinylphenol, benzocyclobutene, or acryl, a material of siloxane based materials or the like can be formed by a spin coating method, a droplet discharging method, a printing method or the like. Thus, planarization or efficiency of processing time can be enhanced. The same material or different materials may be used for the insulating films 605 and 607.

As the conductive film 606, a conductive material including one or plurals of a metal such as copper (Cu), aluminum (Al), silver (Ag), gold (Au), chromium (Cr), molybdenum (Mo), titanium (Ti), tantalum (Ta), tungsten (W), nickel (Ni), a metal compound, carbon (C).

Figure 8B:
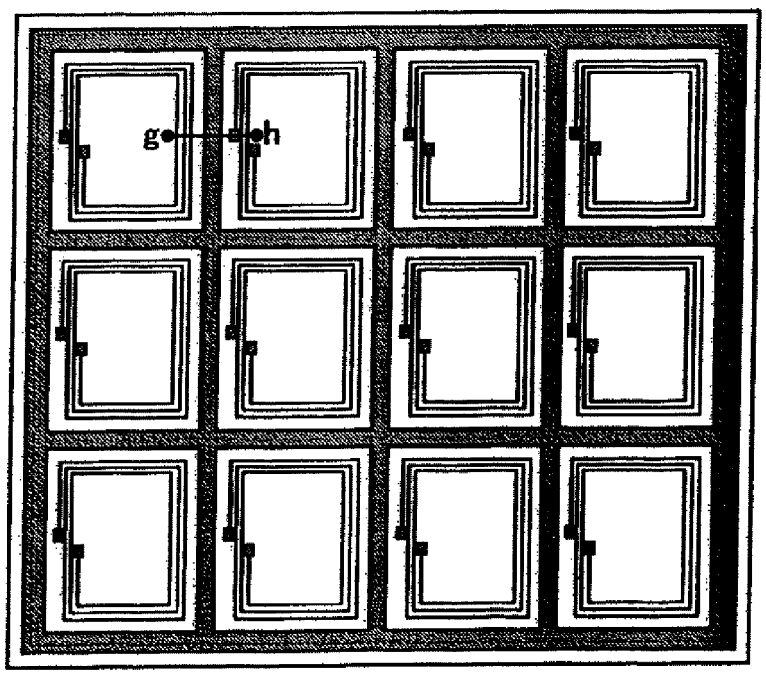

Note that in the above embodiment mode, the case that when plural semiconductor devices are provided over the substrate 101, the semiconductor film 103 is formed in the whole region is explained; however, the present invention is not limited to the case, when plural semiconductor devices are provided over the substrate 101, a semiconductor film may be formed in each semiconductor device as shown in FIG. 8B. Specifically, after forming the semiconductor film over the substrate 101, the semiconductor film which exists between the semiconductor devices is removed while leaving a region in which the semiconductor device is provided. In this case, since it is not necessary to remove when the opening portion 609 is provided, the process can be become simple and easy. In addition, the semiconductor device can be manufactured using the thin film transistor having the structure shown in Embodiment Mode 2.

Application examples of a semiconductor device which can transmit and receive data without contact are described with reference to drawings. The semiconductor device which can transmit and receive data without contact is generally referred to as an RFID (Radio Frequency Identification) tag, an ID tag, an IC tag, an IC chip, an RF (Radio Frequency) tag, a wireless tag, an electronic tag, or a wireless chip.

Figure 12A:
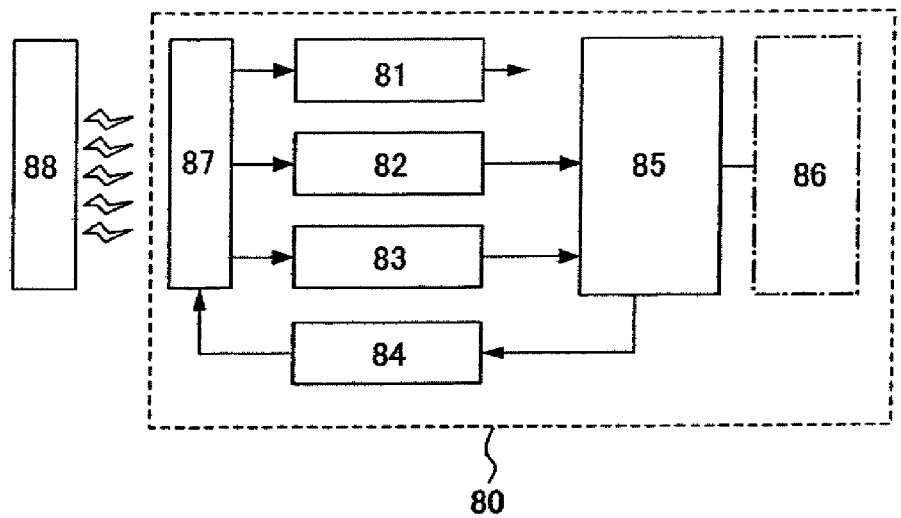
FIGS. 12A to 12C show one example of usage of the semiconductor device of the present invention.

An RFID 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 12A). Further, the RFID may include plural memory circuits, rather than one memory circuit. An SRAM, a flash memory, a ROM, a FeRAM, a circuit, which uses an organic compound layer shown in the above described embodiment modes in a memory element portion, and the like can be used.

Signals sent from a reader/writer 88 as radio waves are modulated into alternating-current electric signals in the antenna 87 by electromagnetic induction. Power supply voltage is generated in the power supply circuit 81 by using the alternating-current electric signals, and supplied to each circuit using a power supply line. The clock generation circuit 82 generates various kinds of clock signals based on the alternating-current electric signals, which are input from the antenna 87, and supplies the various kinds of clock signals to the control signal 85. The modulation circuit 83 demodulates the alternating-current electric signals and supplies the demodulated alternating-current electric signals to the control circuit 85. In the control circuit 85, various kinds of arithmetic processings are performed in accordance with the input signals. Programs, data and the like that are used in the control circuit 85 are stored in the memory circuit 86. In addition, the memory circuit 86 can also be used as a work area in the arithmetic processings. Then, data is transmitted to the modulation circuit 84 from the control circuit 85, and load modulation can be added to the antenna 87 from the modulation circuit 84 in accordance with the data. Consequently, the reader/writer 88 receives load modulation applied to the antenna 87 via radio waves so that the reader/writer can read the data.

In addition, the RFID may be of a type in that power supply voltage is supplied to each circuit via radio waves without having a power source (a buttery), or another type in that power supply voltage is supplied to each circuit by utilizing both radio waves and a power source (a buttery).

A foldable RFID can be manufactured by employing such a structure described in the above embodiment modes, and thus, such RFID can be attached to an article having a curbed surface.

Figure 12B:
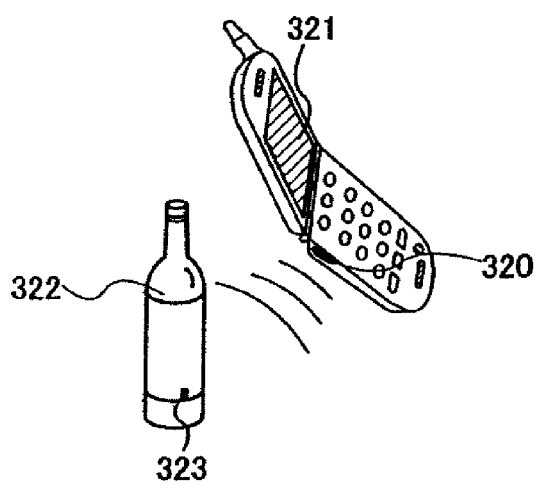
Figure 12C:
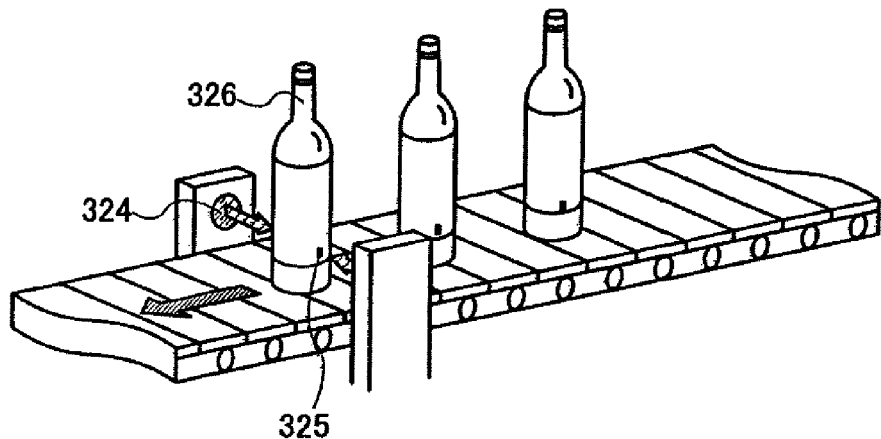
Figure 13A:
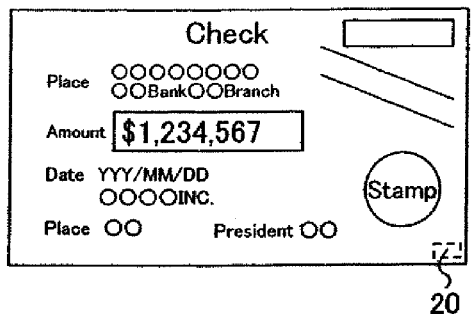
FIGS. 13A to 13H each show one example of usage of the semiconductor device of the present invention.
Figure 13B:
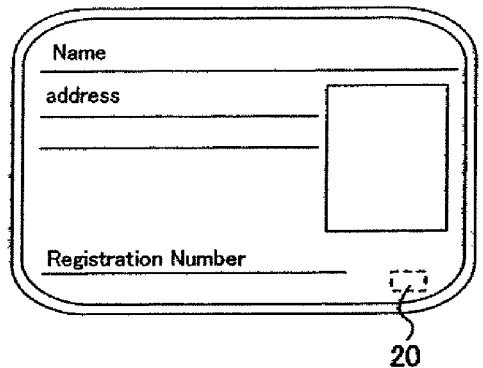
Figure 13C:
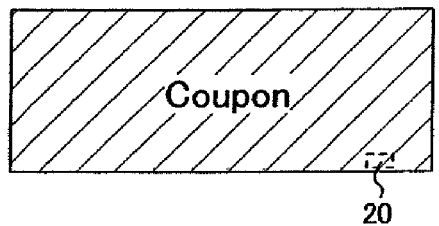
Figure 13D:
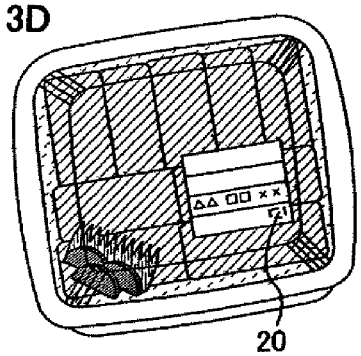
Figure 13E:
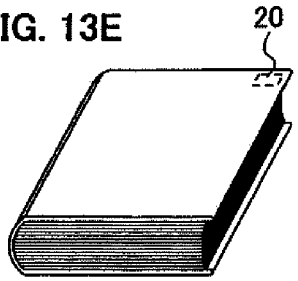
Figure 13F:
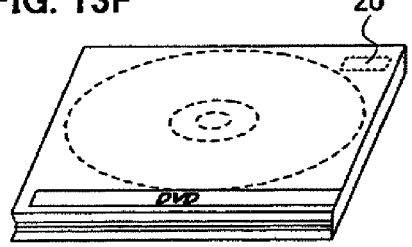
Figure 13G:
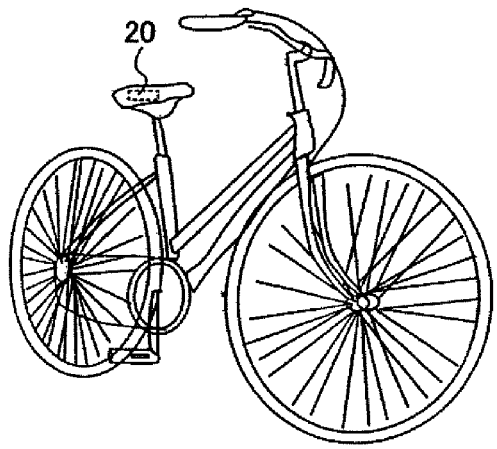
Figure 13H:

Next, an example of usage mode of a flexible RFID will be described. A reader/writer 320 is provided on a side surface of a portable terminal that includes a display portion 321. An RFID 323 is provided on a side surface of a product 322 (FIG. 12B). When holding the reader/writer 320 over the RFID 323 included in the product 322, information about the product such as a raw material, a place of origin, test results in each production process, history of distribution process, and a description of a commodity, is displayed on the display portion 321. In addition, when conveying a commodity 326 by a belt conveyor, the inspection of the commodity 326 can be carried out by utilizing a reader/writer 320 and an RFID 325 provided on the commodity 326 (FIG. 12C). In this way, by utilizing an RFID for a system, information can be easily obtained, thereby realizing high performance and high added value. As described in the above embodiment modes, even when an RFID is attached to an article having a curved surface, damages to a thin film transistor or the like included in the RFID can be avoided. A highly reliable RFID can be provided.

With the exception of the described above, the application range of an RFID tag having flexibility is so wide that it may be applied to any object in order that the history thereof is revealed wirelessly and utilized in production, management and the like. For example, the REID tag may be incorporated in bills, coins, securities, certificates, bearer bonds, containers for packages, books, recording media, personal belongings, vehicles, foods, clothes, healthcare items, livingware, medicals, and electronic apparatuses. Examples of these objects are described with reference to FIGS. 13A to 13H.

The bills and coins include currency in the market and include a note that is in currency in a specific area as money (cash voucher), memorial coins, and the like. The securities include a check, a certificate, a promissory note, and the like (see FIG. 13A). The certificates include a driving license, a resident card, and the like (see FIG. 13B). The bearer bonds include a stamp, a rice coupon, various gift coupons, and the like (see FIG. 13C). The containers for packages include paper for packing a box lunch or the like, a plastic bottle, and the like (see FIG. 13D). The books include a document and the like (see FIG. 13E). The recording media include DVD software, a video tape, and the like (see FIG. 13F). The vehicles include a wheeled vehicle such as a bicycle, a vessel, and the like (see FIG. 13G). The personal belongings include a bag, glasses, and the like (see FIG. 13H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic apparatuses include a liquid crystal display device, an EL display device, a television set (television receiver, thin television receiver), a mobile phone, and the like.

When an RFID tag is incorporated in bills, coins, securities, certificates, bearer bonds, and the like, forgery of them can be prevented. When an RFID tag is incorporated in containers for packages, books, recording media, personal belongings, foods, livingware, electronic apparatuses, and the like, inspection systems, rental systems and the like can be performed more efficiently. When an RFID tag is incorporated in vehicles, healthcare items, medicals, and the like, forgery and theft of them can be prevented and medicines can be prevented from being consumed in the wrong manlier. An RFID) tag may be attached to the surface of a product or incorporated into a product. For example, an RFID tag may be incorporated into the paper of a book, or an organic resin of a package. By using a flexible RFID tag having the structure described in the above embodiment mode, damage or the like of an element included in the RFID tag can be prevented even when the RFID tag is mounted on paper or the like.

In this manner, when an RFID tag is incorporated in containers for packages, recording media, personal belongings, foods, clothes, livingware, electronic apparatuses, and the like, inspection system, rental system and the like can be performed more efficiently. An RFID tag also prevents vehicles from being forged or stolen. In addition, when an RFID tag is implanted into creatures such as animals, each creature can be identified easily. For example, when an RFID tag is implanted into creatures such as domestic animals, not only the year of birth, sex, breed and the like but also the current body temperature can be easily controlled.

Note that this embodiment mode can be freely combined with the above Embodiment Modes 1 and 2.

Embodiment Mode 4

In this embodiment mode, a structure of a semiconductor device of the present invention which is different from that of the above embodiment modes is described with reference to drawings. Specifically, an example of the semiconductor device having a pixel portion is described.

Figure 14A:
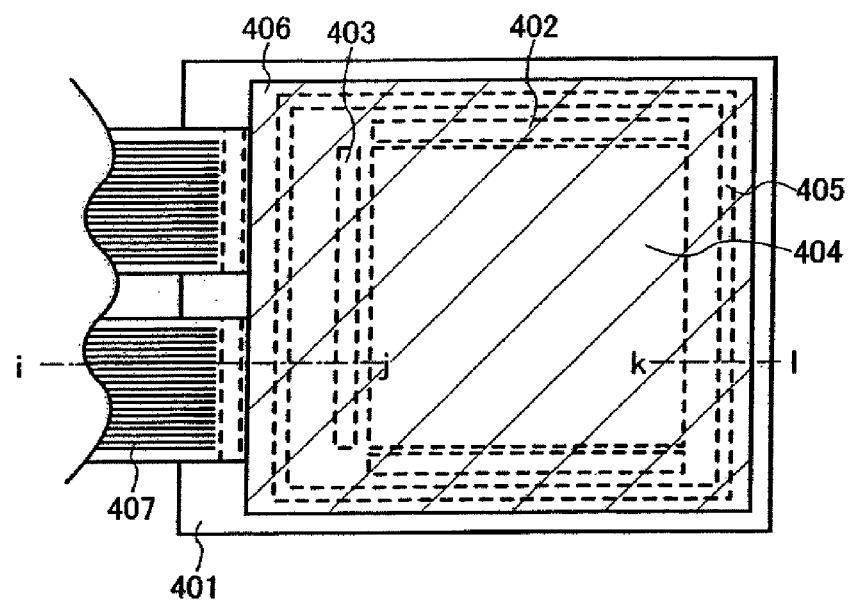
FIGS. 14A and 14B show one example of a semiconductor device of the present invention.

As shown in FIG. 14A, the semiconductor device shown in this embodiment mode includes a scanning line driver circuit 402, a signal line driver circuit 403, a pixel portion 404 and the like over a substrate 401. In addition, an opposite substrate 406 is provided to sandwich the pixel portion 404 with a substrate 401. The scanning line driver circuit 402, the signal line driver circuit 403, and the pixel portion 404 are formed over the substrate 401 using a thin film transistor having a structure described in the embodiment modes described above. The substrate 401 and the opposite substrate 406 are bonded to each other by a sealing material 405. In addition, the scanning line driver circuit 402, and the signal line driver circuit 403 receive a video signal, a clock signal, a start signal, a reset signal and the like from an FPC 407 that is an external input terminal.

Next, an example of the pixel portion 404 is described with reference to FIG. 14B.

Figure 14B:
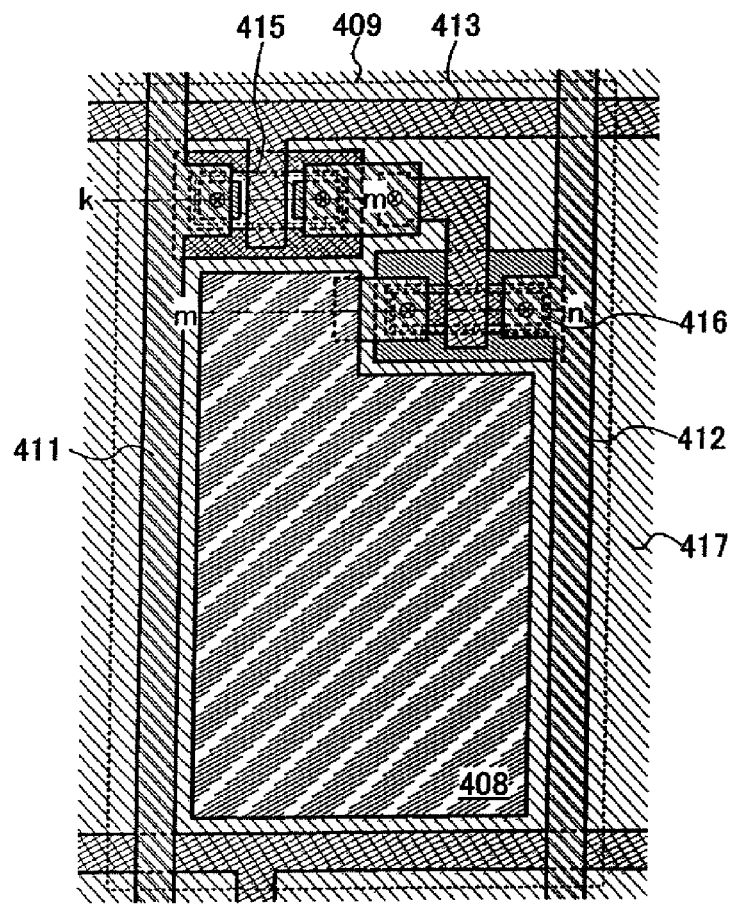

FIG. 14B shows a top-view of one pixel 409 provided in a pixel portion 404 which is one of plural pixels. The pixel 409 has a wiring 411 which functions as a signal line, a wiring 412 which functions as a power line, and a wiring 413 which functions as a scanning line extending in an almost vertical direction to the wirings 411 and 412. In addition, a display region 408 is formed in the pixel 409 so as to be surrounded with the wirings 411, 412, and 413, and has a thin film transistor 415 and a thin film transistor 416 for driving the display region 408. Here, the thin film transistor 415 is referred to as a switching TFT 415, and the thin film transistor 416 is referred to as a current controlling TFT 416 for convenience.

FIG. 14B shows a case that the switching TFT 415 is provided as an n-channel thin film transistor, and the current controlling TFT 416 is provided as a p-channel thin film transistor. The switching TFT 415 and the current controlling TFT 416 which are provided in the pixel 409 share a semiconductor film 417 provided continuously as a channel region. In other words, here, the thin film transistor provided in plural pixels of the pixel portion 404 shares the semiconductor film 417 as a channel region. The n-channel thin film transistor and the p-channel thin film transistor can have the structure shown in FIGS. 1A to 1C of the Embodiment Mode 1. Note that FIG. 14B shows the example in which the semiconductor film 417 is provided in the whole region of the pixel 409; however, in the switching TFT 415 and the current controlling TFT 416, the semiconductor film can also be removed and provided by island shape as shown in FIGS. 5A to 6B of Embodiment Mode 2.

An example of a cross-sectional structure of the semiconductor device shown in FIGS. 14A and 14B is shown in FIGS. 15A and 15B.

Thin film transistors which configure a driver circuit portion and a pixel portion are formed over the substrate 401 as shown in FIG. 15A. In the driver circuit portion, a CMOS circuit in which the n-channel thin film transistor and the p-channel thin film transistor having the structure shown in the above embodiment mode are combined is formed. A thin film transistor forming the driver circuit may be formed with a known PMOS circuit or an NMOS circuit.

In the pixel 409, the switching TFT 415 and the current controlling TFT 416 having the structure shown in the above embodiment mode are provided. In addition, a first electrode 424 connected to a source or drain electrode of the current controlling TFT 416, an insulating film 423 provided to cover an end portion of the first electrode, a light-emitting layer 425 provided over the first electrode, and a second electrode 426 provided over the light-emitting layer 425 are included. Note that a light-emitting element 427 is provided with a stacked structure of the first electrode 424, the light-emitting layer 425 and the second electrode 426.

As the insulating film 423, a positive type photosensitive acrylic resin film is used. In order to improve the coverage, the insulating film 423 is formed so as to have curvature at its upper end or lower end. For example, in the case of using positive photosensitive acrylic for the insulating film 423, only the upper end portion of the insulating film 423 preferably has a curved surface with a radius of curvature (0.2 to 0.3 μm). The insulating film 423 may be formed with either a negative type, which becomes insoluble to the etchant by the irradiation of light, or a positive type, which becomes soluble to the etchant by the irradiation of light.

The first electrode 424 and the second electrode 426 use one as anode and the other as a cathode. In the case of being used as the anode, a material with a high work function is preferably used. For example, not only a single layer film such as an ITO film, an indium tin oxide film containing silicon, an indium oxide film containing zinc oxide of 2 to 20 wt %, a titanium nitride film, a chromium film, a tungsten film, a Zn film, or a Pt film, but also a stacked layer of a titanium nitride film and a film containing aluminum as its main component, a three-layer structure of a titanium nitride film, a film containing aluminum as its main component, and a titanium nitride film or the like can be used. Note that when employing a stacked structure, resistance of a wiring becomes low, a favorable ohmic contact can be obtained, and further the stacked structure can function as an anode. In the case of being used as the cathode, a material with a low work function (Al, Ag, Li, Ca, or an alloy thereof such as MgAg, MgIn, AlLi, $CaF_2$, or $Ca_3N_2$) is preferably used. Note that in a case of making the electrode used as the cathode to have light transmitting properties, a stacked layer of a metal thin film whose thickness is thinned and a transparent conductive film is preferably used as the electrode. As the transparent conductive film, for example, ITO, indium oxide containing zinc oxide of 2 to 20 wt %, indium tin oxide containing silicon, zinc oxide (ZnO) or the like can be used.

As the light emitting layer 425, a single layer or a stacked structure such as a low molecular material, a middle molecular material (including oligomer and dendrimer), or a high molecular material can be formed by a known method such as an evaporation method using an evaporation mask, an inkjet method, or a spin coating method.

An epoxy resin is preferably used as the sealing material 405. Such materials are preferably materials which do not transmit moisture or oxygen as much as possible.

As the opposite substrate 406, a plastic substrate made from FRP (Fiberglass-Reinforced Plastics), PVF (polyvinyl fluoride), mylar, polyester, acryric, or the like can be used as well as a glass substrate or a quartz substrate.

The semiconductor device shown in FIG. 15A has a structure in which light is emitted to the counter substrate 406 side (top emission) since a semiconductor film is formed in the whole region of the pixel 409. Therefore, the second electrode 426 is formed with a light-transmitting material.

Meanwhile, light can be emitted to the substrate 401 side (bottom emission) by forming a semiconductor film with island shape in the pixel 409 as shown in Embodiment Mode 2. In this case, the first electrode 414 is formed with a light-transmitting material. In addition, in the semiconductor device shown in FIG. 15B, light can be emitted to the counter substrate 406 side (top emission) and to both of the substrate 401 side and the counter substrate 406 side (dual emission).

Next, a video camera, a digital camera, a goggle type display (a head mounted display), a navigation system, an audio reproducing device (a car audio set, an audio component set and the like), a notebook personal computer, a game machine, a portable information terminal (a mobile computer, a portable phone, a portable game machine, an electronic book, and the like), an image reproducing device provided with a recording medium (specifically, a device which reproduces a recording medium such as a DVD: Digital Versatile Disc and has a display which can display the reproduced image) and the like can be given as a type of usage of the semiconductor device having the pixel portion. Specific examples of these semiconductor devices are hereinafter explained with reference to drawings.

Figure 16A:
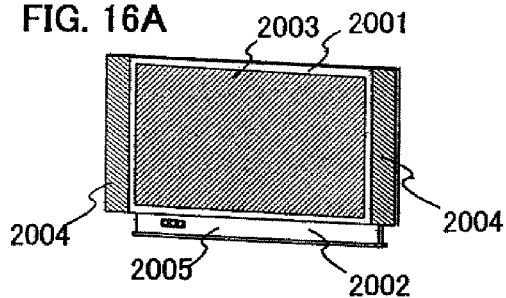
FIGS. 16A to 16H each show one example of usage of the semiconductor device of the present invention.

FIG. 16A shows a television receiver machine including a chassis 2001, a supporting stand 2002, a display portion 2003, speaker units 2004, a video input terminal 2005, and the like. The television receiver machine can be manufactured by applying a constitution described in any one of the above embodiment modes to the display portion 2003 and a thin film transistor provided in a driver circuit or the like.

Figure 16B:
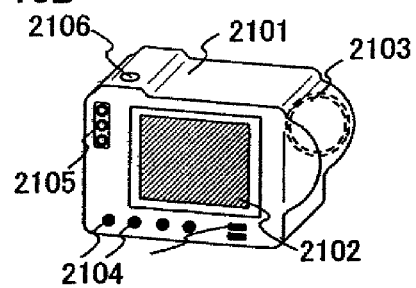

FIG. 16B shows a digital camera including a main body 2101, a display portion 2102, an image receiving portion 2103, operation keys 2104, an external connection port 2105, a shutter 2106, and the like. The digital camera can be manufactured by applying a constitution described in any one of the above embodiment modes to the display area 2102 and a thin film transistor provided in a driver circuit or the like.

Figure 16C:
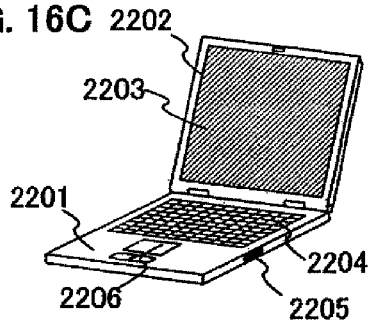

FIG. 16C shows a computer including a main body 2201, a chassis 2202, a display area 2203, a keyboard 2204, an external connection port 2205, a pointing mouse 2206, and the like. The computer can be manufactured by applying a constitution described in any one of the above embodiment modes to the display area 2203 and a thin film provided in a driver circuit or the like.

Figure 16D:
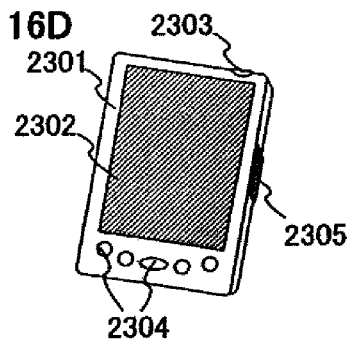

FIG. 16D shows a mobile computer including a main body 2301, a display portion 2302, a switch 2303, operation keys 2304, an infrared port 2305, and the like. A moving image or a still image can be displayed by using the display portion 2302. The mobile computer can be manufactured by applying a constitution described in any one of the above embodiment modes to the display portion 2302 and a thin film transistor provided in a driver circuit or the like.

Figure 16E:
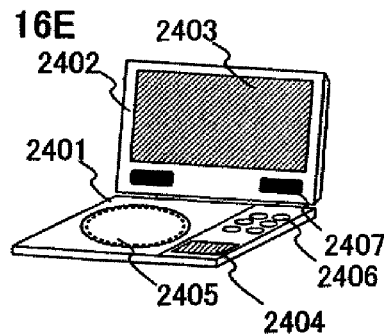

FIG. 16E shows a mobile image reproduction device equipped with a recording medium (such as a DVD reproduction device) including a main body 2401, a chassis 2402, a display portion A 2403, a display portion B 2404, a recording-medium (DVD, and the like) reader portion 2405, an operation key 2406, a speaker unit 2407, and the like. The display portion A 2403 mainly displays image information, while the display portion B 2404 mainly displays text information. The image reproduction device can be manufactured by applying a constitution described in any one of the above embodiment modes to the display portion A 2403 and the display portion B 2404 and a thin film transistor provided in a driver circuit or the like. The image reproduction device equipped with a recording medium includes the game machine and the like.

Figure 16F:
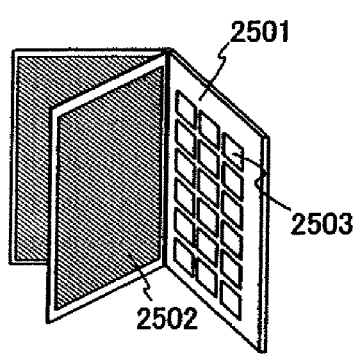

FIG. 16F shows an electronic book, which includes a main body 2501, a display portion 2502, an operation key 2503, and the like. In addition, a modem may be incorporated in the main body 2501. The display portion 2502 can display a moving image as well as a still image such as a character. The electronic book can be manufactured by applying a constitution described in any one of the above embodiment modes to the display portion 2502 and a thin film transistor provided in a driver circuit or the like.

Figure 16G:
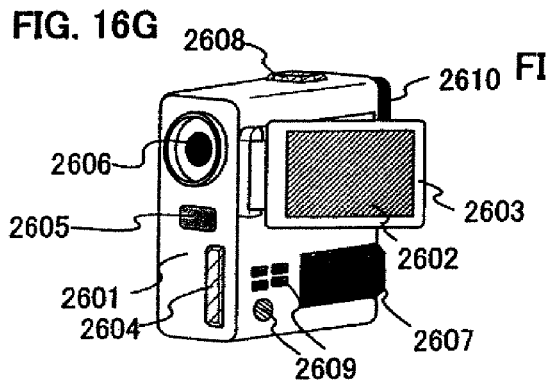

FIG. 16G shows a video camera including a main body 2601, a display portion 2602, a chassis 2603, an external connection port 2604, a remote controller receiving portion 2605, an image receiving portion 2606, a battery 2607, an audio input portion 2608, operation keys 2609, an eyepiece portion 2601, and the like. The video camera can be manufactured by applying a constitution described in any one of the above embodiment modes to the display portion 2602 and a thin film transistor provided in a driver circuit or the like.

Figure 16H:
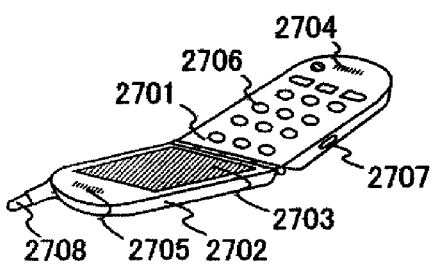
Figure 17A:
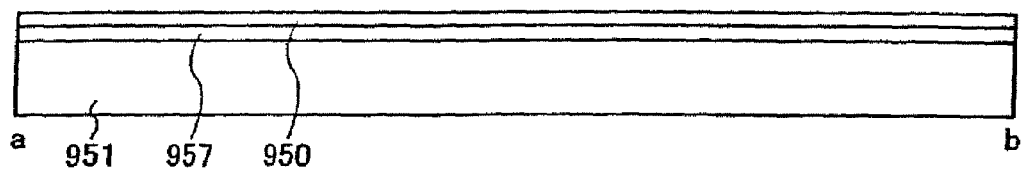
FIGS. 17A to 17E show one example of a manufacturing method of a conventional semiconductor device.
Figure 17B:
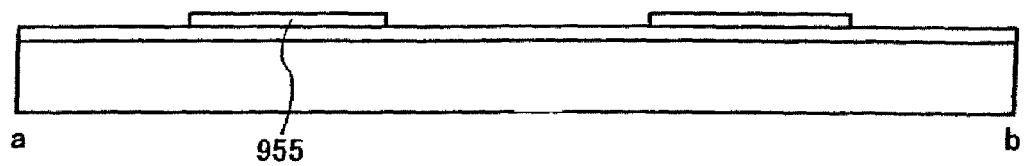
Figure 17C:
Figure 17D:
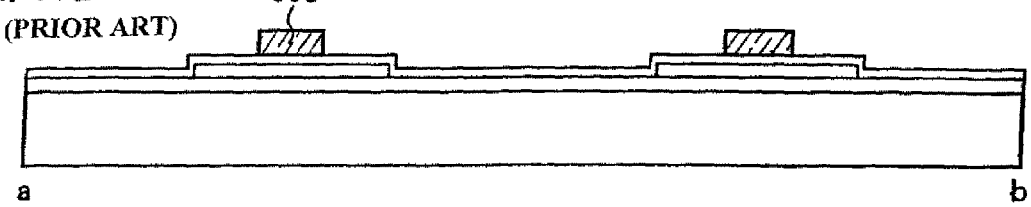
Figure 17E:
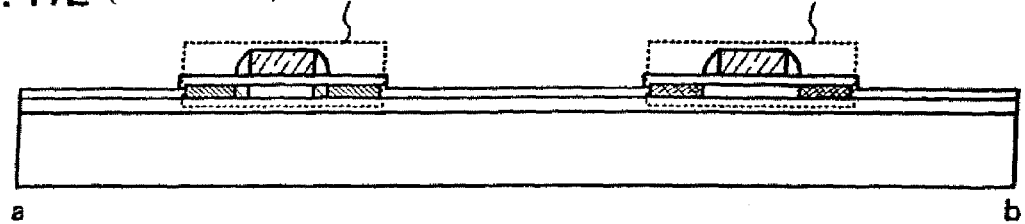
Figure 18A:
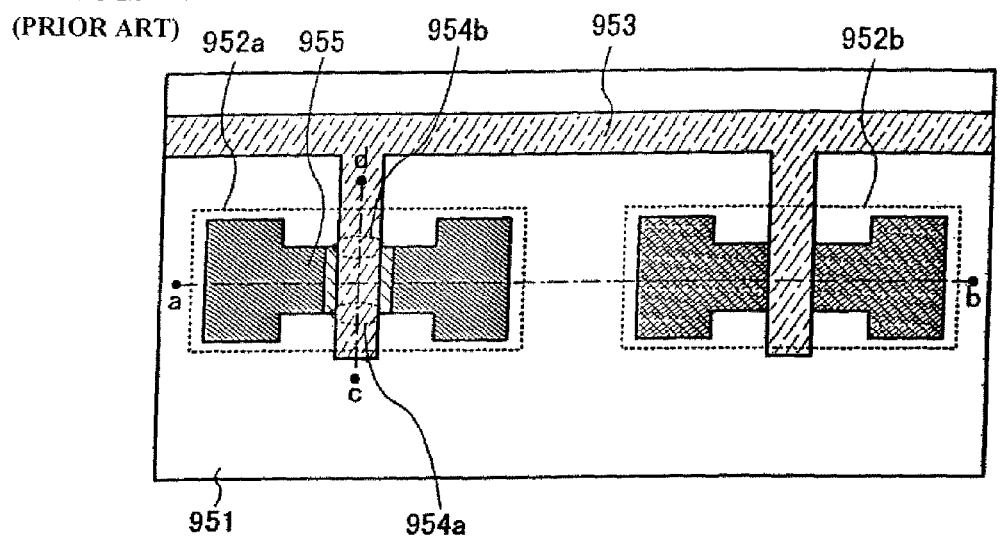
FIGS. 18A to 18D show one example of a conventional semiconductor device.
Figure 18B:
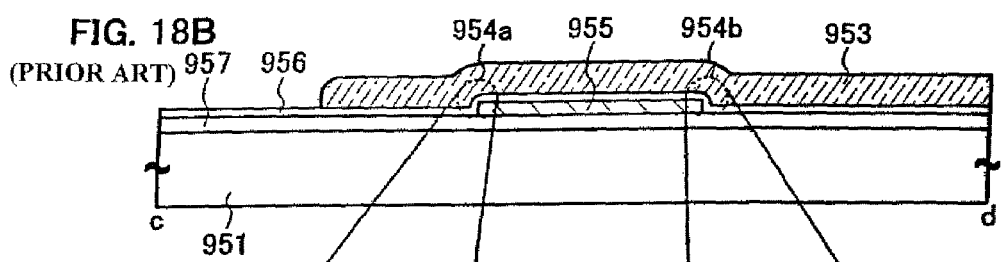
Figure 18C:
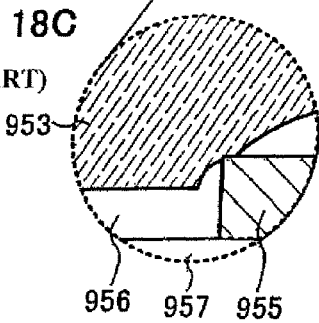
Figure 18D:
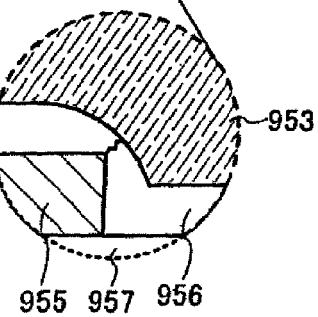

FIG. 16H shows a cellular phone including a main body 2701, a chassis 2702, a display area 2703, an audio input portion 2704, an audio output portion 2705, an operation key 2706, an external connection port 2707, an antenna 2708, and the like. The cellular phone can be manufactured by applying a constitution described in any one of the above embodiment modes to the display portion 2703 and a thin film transistor provided in a driver circuit or the like.

As thus described, the semiconductor device or the present invention can be applied in a wide range, and can be applied to electronic devices in all fields. This embodiment mode can be freely combined with the above Embodiment Modes 1 to 3.

Embodiment Mode 5

In this embodiment mode, a structure of a semiconductor device of the present invention which is different from those of the above embodiment modes is described with reference to drawings. Specifically, an example of a semiconductor device having a memory element is described.

Figure 20:
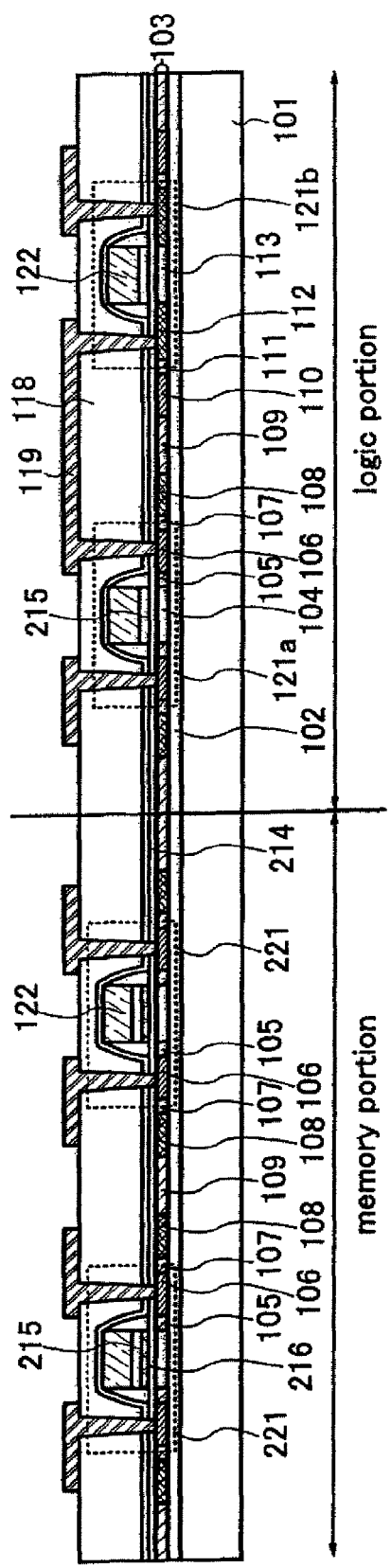
FIG. 20 shows one example of a semiconductor device of the present invention.

An example of the semiconductor device of this embodiment mode is shown in FIG. 20. The semiconductor device shown in FIG. 20 is formed of a memory portion including memory elements and a logic portion which controls the memory portion etc. Here, an example in which the n-channel thin film transistor 121a and the p-channel thin film transistor 121b are formed in the logic portion, and a memory element 221 is formed in the memory portion is described.

The n-channel thin film transistor 121a in the logic portion has the n-type high concentration impurity region 106 which functions as a source or drain region and the n-type low concentration impurity region 105 which functions as an LDD region. In addition, the n-type low concentration impurity region 105 is formed in the semiconductor film 103 provided under the side wall. Meanwhile, the p-channel thin film transistor 121b has the p-type high concentration impurity region 112 which functions as a source or drain region. In addition, the n-channel thin film transistor 121a and the p-channel thin film transistor 121b share the semiconductor film 103 which is provided continuously as channel regions, and an insulating film 214 and an insulating film 215 are stacked and provided over the channel regions. The insulating film 214 and the insulating film 215 function as gate insulating films.

The memory element 221 in the memory portion has the n-type high concentration impurity region 106 which functions as a source or drain region and the n-type low concentration impurity region 105 which functions as an LDD region. In addition, the n-type low concentration impurity region 105 is provided in the semiconductor film 103 provided under the side wall. Plural memory elements 221 share the semiconductor film formed continuously as the channel regions. The insulating film 214 and an element 216 and the insulating film 215 are stacked over each of the channel regions. The memory portion functions as a memory element by accumulating an electrical charge in the element 216 formed between the insulating film 214 and the insulating film 215. In the memory portion, there is a case that the insulating film 214 is referred to as a tunnel oxide film, the element 216 is referred to as a floating gate, and the insulating film 215 is referred to as a controlling oxide film.

As the insulating film 214, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be used.

A conductive film, a semiconductor film, a dispersed conductive particle or a semiconductor particles (hereinafter, referred to as dispersed particles), an insulating film which is different from the insulating film 214 and the insulating film 215 in a dielectronic constant or the like can be used as the element 216. As a material for the conductive film and the conductive particle, gold (Au), silver (Ag), copper (Cu), palladium (Pd), platinum (Pt), cobalt (Co), tungsten (W), nickel (Ni), or the like can be used. As a material for the semiconductor film and the semiconductor particle, silicon (Si), germanium (Ge), silicon germanium alloy, or the like can be used. As the insulating film which is different from the insulating film 214 and the insulating film 215 in a dielectronic constant or the like, for example, when silicon oxide ($SiO_x$), silicon oxynitride ($SiO_xN_y$) (x>y) is used as the insulating film 214 and the insulating film 215, silicon nitride ($SiN_x$) or silicon nitride oxide ($SiN_xO_y$) (x>y) can be used as the element 216.

As the insulating film 215, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be used. The insulating film 215 is required to keep insulation of the element 216 from a gate electrode 122 in the memory element 221. Accordingly, it is preferable that the insulating film 215 is formed to have a thickness that does not allow a leak current to increase between the element 216 and the gate electrode 122 The insulating film 215 is preferably formed to have a thickness of 1 to 100 nm, more preferably, 10 to 70 nm, and further more preferably 10 to 30 nm.

In this embodiment mode, the structure of the thin film transistor can be not only the structure shown in FIG. 20 but also any structures described above. In addition, the structure of the memory element can also have any structures described above in the common portion with the thin film transistor.

Next, an example of a manufacturing method of the semiconductor device described above is described with reference to drawings. Here, a manufacturing method of a memory portion in FIG. 20 is described hereinafter.

Figure 21A:
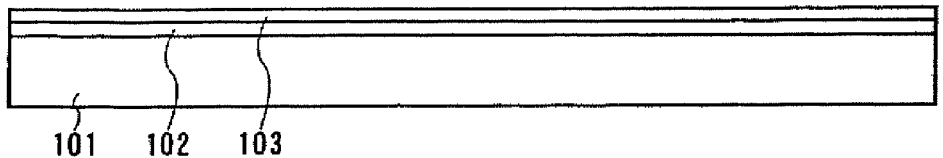
FIGS. 21A to 21F show one example of a manufacturing method of the semiconductor device of the present invention.

First, the semiconductor film 103 is formed over the substrate 101 with the insulating film 102 therebetween (FIG. 21A). Note that the semiconductor 103 is crystallized by using the method described above.

Figure 21B:
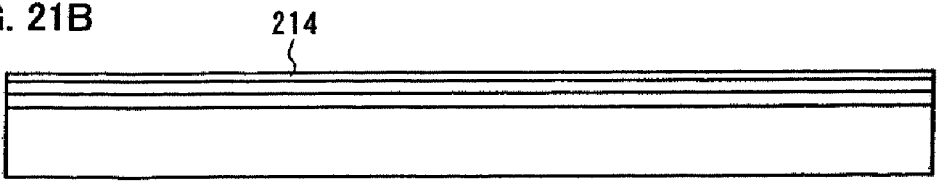

Next, the insulating film 214 is formed over the semiconductor film 103 (FIG. 21B). As a manufacturing method of the insulating film 214, the surface of the semiconductor film 103 is oxidized to form an oxide film by using GRTA (Gas Rapid Thermal Anneal), LRTA (Lamp Rapid Thermal Anneal), and highly dense plasma treatment in an oxygen atmosphere or the like, consequently, an oxide film, namely, an insulating film having a thin thickness is formed. Alternatively, PVD (Physical Vapor Deposition), CVD (Chemical Vapor Deposition), spin coating, or the like may be used. The insulating film 214 is preferably formed to have a thickness of 1 to 100 nm, more preferably, 1 to 10 nm, further more preferably, 2 to 5 nm. The insulating film 214 functions as a tunnel oxide film in a memory element 221 of the memory portion. Accordingly, as the thickness of the insulating film 214 is thinner and thinner, an electrical charge can be accumulated in the element 216 with lower voltage. Thus, a power consumption of the semiconductor device which is formed later can be reduced. When silicon oxide is formed in contact with the semiconductor film 103, it is preferable that an interface state between the insulating film 214 and a semiconductor film region becomes low. Here, the insulating film 214 is formed by stacking a silicon oxide film and a silicon nitride film.

Figure 21C:
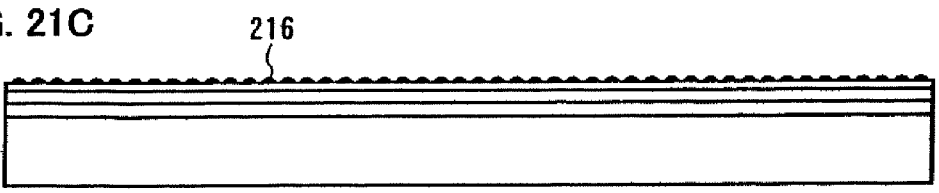

Then, the element 216 is formed over the semiconductor film 103 (FIG. 21C). Here, a silicon particle is formed over the semiconductor film 103 by LPCVD (Low Pressure Chemical Vapor Deposition) as the element 216.

Figure 21D:
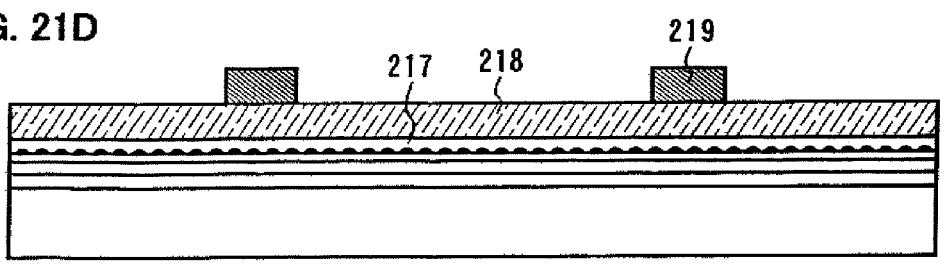

An insulating film 217 is formed to cover the element 216, and after forming a conductive film 218 over the insulating film 217, a resist 219 which functions as a mask is formed selectively (FIG. 21D). The insulating film 217 is required to keep insulation between the element 216 and a gate electrode in the memory element 221. Accordingly, it is preferable that the insulating film 217 is formed to have a thickness that does not allow a leak current to increase between the element 216 and the conductive film 218. The insulating film 217 is preferably formed to have a thickness of 1 to 100 nm, more preferably, 10 to 70 nm, and further more preferably 10 to 30 nm. The conductive film 218 can be formed by a known method such as sputtering, vapor deposition, CVD or the like. The conductive film 218 can be formed using an element selected from tantalum (Ta), tungsten (W), titanium (Ti), molybdenum (Mo), aluminum (Al), chromium (Cr), and neodymium (Nd), or an alloy material or a compound material containing such an element as a main component. Alternatively, the conductive film 218 can be formed with a semiconductor film doped with an impurity element.

Figure 21E:
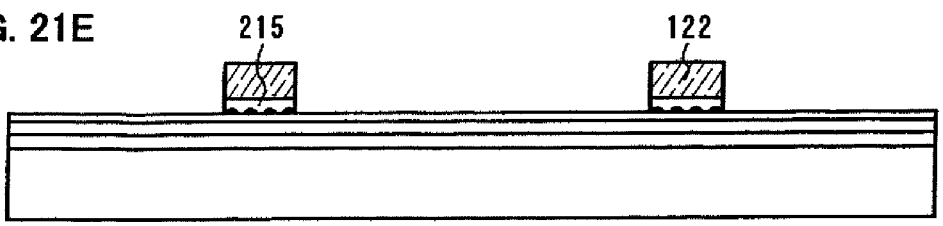

The conductive film 218, the insulating film 217, and the element 216 are selectively removed using the resist 219 as a mask to form the insulating film 215 and the gate electrode 212 (FIG. 21E). Here, although an example in which the conductive film 218, the insulating film 217, and the element 216 is removed selectively, only the conductive film 218 can be removed selectively without removing the insulating film 217 and the element 216.

Figure 21F:
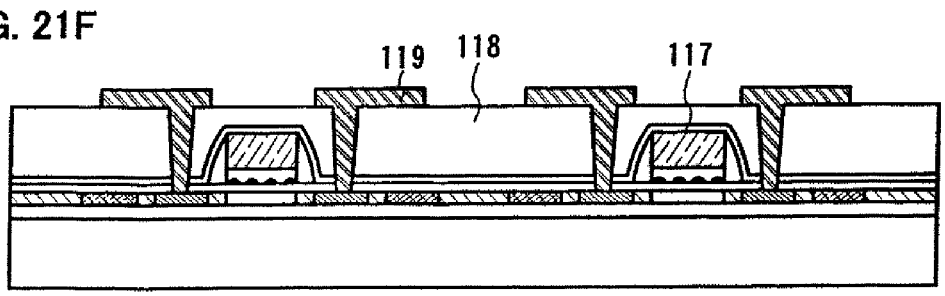

Next, a memory element can be manufactured by forming the insulating films 117 and 118 and the conductive film 119 or the like by using the above method (FIG. 21F).

The memory element shown in FIG. 21A to 21F can store data by injecting and accumulating electrical charge in the element 216. There are two methods of injecting an electron to the element 216. One is a method using a thermoelectron, the other is a method using an F-N type tunnel current. When a thermoelectron is used, positive voltage is applied to the gate electrode 122. In this state, when high voltage is applied to a drain and a thermoelectron is generated, a thermoelectron which can go over a first barrier can be injected to the element 216. When an F-N type tunnel current is used, it is not necessary to give energy for going over the first barrier to an electron. The electron is injected into the element 216 by quantum tunneling.

While an electron is held in the element 216, threshold voltage of a transistor is shifted to a positive direction. This state is a state in which data "0" is written in. Detection of data of "0" is possible by detecting a state in which a transistor does not turn ON by a sense circuit when a gate voltage in which the transistor turns ON is applied in a state in which an electron charge is not held in the element 216.

As described above, a memory element can be provided so that a step at a semiconductor film of a channel region does not occur by forming the memory element by using a semiconductor film provided continuously. Accordingly, a break or the like of the insulating film in the channel region of the memory element can be prevented, and a charge holding property in a memory element can be improved by suppressing a short circuit between a semiconductor film and a gate electrode, and generation of a leakage current.

Note that this embodiment mode can be freely combined with the above Embodiment Modes 1 to 4.

The application is based on Japanese Patent Application serial No. 2005-153834 filed in Japan Patent Office on May, 26, 2005 the entire contents of which are hereby incorporated by reference.

The invention claimed is:

1. A semiconductor device comprising:
a thin film transistor, the thin film transistor comprising:
   a continuous semiconductor film;
   a gate insulating film over the continuous semiconductor film; and
   a conductive layer over the gate insulating film,
   wherein the continuous semiconductor film comprises:
      a first region including a first impurity element;
      a channel region overlapping with the conductive layer;
      a source region and a drain region between the channel region and the first region, wherein the source region and the drain region include a second impurity element having a different conductivity type from the first impurity element; and
      a second region between the source region and the first region, wherein the second region includes the second impurity element and a concentration of the second impurity element of the second region is lower than that of the source region.

2. The semiconductor device according to claim 1, further comprising a third region surrounding a side surface of the first region.

3. The semiconductor device according to claim 1, wherein the gate insulating film is in contact with a side surface of the first region.

4. The semiconductor device according to claim 1, wherein the continuous semiconductor film further comprises:
   a first LDD region between the channel region and the source region; and
   a second LDD region between the channel region and the drain region.

5. The semiconductor device according to claim 1, further comprising:
   a source electrode electrically connected to the source region; and
   a drain electrode electrically connected to the drain region,
   wherein the source electrode and the drain electrode comprise aluminum alloy including carbon.

6. The semiconductor device according to claim 2, wherein the conductive layer overlaps with the third region.

7. The semiconductor device according to claim 1, wherein the conductive layer does not overlap the first region.

8. A semiconductor device comprising:
a thin film transistor, the thin film transistor comprising:
   a continuous semiconductor film;
   a gate insulating film over the continuous semiconductor film; and
   a conductive layer over the gate insulating film,
   wherein the continuous semiconductor film comprises:
      a first region including a first impurity element;
      a channel region overlapping with the conductive layer;
      a source region and a drain region between the channel region and the first region, wherein the source region and the drain region include a second impurity element having a different conductivity type from the first impurity element; and
      a second region between the source region and the first region, wherein the second region includes the first impurity element, in which a concentration of the first impurity element of the second region is lower than that of the first region.

9. The semiconductor device according to claim 8, further comprising a third region surrounding a side surface of the first region.

10. The semiconductor device according to claim 8, wherein the gate insulating film is in contact with a side surface of the first region.

11. The semiconductor device according to claim 8, wherein the continuous semiconductor film further comprises:
   a first LDD region between the channel region and the source region; and
   a second LDD region between the channel region and the drain region.

12. The semiconductor device according to claim 8, further comprising:
   a source electrode electrically connected to the source region; and
   a drain electrode electrically connected to the drain region, wherein the source electrode and the drain electrode comprise aluminum alloy including carbon.

13. The semiconductor device according to claim 9, wherein the conductive layer overlaps with the third region.

14. The semiconductor device according to claim 8, wherein the conductive layer does not overlap the first region.

15. A semiconductor device comprising:
   a first thin film transistor, the first thin film transistor comprising:
      a continuous semiconductor film;
      a gate insulating film over the continuous semiconductor film; and
      a conductive layer over the gate insulating film,
   a second thin film transistor, the second thin film transistor comprising:
      the continuous semiconductor film;
      the gate insulating film over the continuous semiconductor film; and
      the conductive layer over the gate insulating film,
   wherein the continuous semiconductor film comprises:
      a first region including a first impurity element;
      a first channel region overlapping with the conductive layer;
      a first source region and a first drain region between the first channel region and the first region, wherein the first source region and the first drain region include a second impurity element having a different conductivity type from the first impurity element;
      a second region between the first source region and the first region, wherein the second region includes the second impurity element, in which a concentration of the second impurity element of the second region is lower than that of the first source region;
      a third region including the second impurity element;
      a second channel region overlapping with the conductive layer;
      a second source region and a second drain region between the second channel region and the third region, wherein the second source region and the second drain region include the first impurity element; and
      a fourth region between the second source region and the third region, wherein the fourth region includes the second impurity element, in which a concentration of the second impurity element of the fourth region is lower than that of the third region.

16. The semiconductor device according to claim 15, further comprising a fifth region surrounding a side surface of the first region and a side surface of the third region.

17. The semiconductor device according to claim 15, wherein the gate insulating film is in contact with a side surface of the first region and a side surface of the third region.

18. The semiconductor device according to claim 15, wherein the continuous semiconductor film further comprises:
   a first LDD region between the first channel region and the first source region; and
   a second LDD region between the first channel region and the first drain region.

19. The semiconductor device according to claim 15, further comprising:
   a source electrode electrically connected to the first source region; and
   a drain electrode electrically connected to the first drain region,
   wherein the source electrode and the drain electrode comprise aluminum alloy including carbon.

20. The semiconductor device according to claim 16, wherein the conductive layer overlaps with the fifth region.

21. The semiconductor device according to claim 15, wherein the conductive layer does not overlap the first region.

* * * * *

UNITED STATES PATENT AND TRADEMARK OFFICE
CERTIFICATE OF CORRECTION

PATENT NO.        : 8,809,862 B2
APPLICATION NO.   : 12/909393
DATED             : August 19, 2014
INVENTOR(S)       : Tamae Takano et al.

It is certified that error appears in the above-identified patent and that said Letters Patent is hereby corrected as shown below:

In the Specification:

Col. 8, line 47, "alumina" should read --alumino--

Col. 9, line 53, "(SiOx, silicon" should read --(SiOx), silicon--

Col. 16, line 64, "REID tag" should read --RFID tag--

Col. 17, line 36, "manlier" should read --manner--

Col. 17, line 37, "RFID) tag" should read --RFID tag--

Col. 21, line 29, "portion etc." should read --portion etc.,--

Signed and Sealed this
Third Day of February, 2015

Michelle K. Lee
*Deputy Director of the United States Patent and Trademark Office*